(12) United States Patent
Song et al.

(10) Patent No.: US 12,334,753 B2
(45) Date of Patent: Jun. 17, 2025

(54) METHOD OF DETECTING FOREIGN OBJECT AND ELECTRONIC DEVICE

(71) Applicant: Samsung Electronics Co., Ltd., Gyeonggi-do (KR)

(72) Inventors: Mingi Song, Gyeonggi-do (KR); Kyungmin Park, Gyeonggi-do (KR); Changhak O, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 561 days.

(21) Appl. No.: 17/893,390

(22) Filed: Aug. 23, 2022

(65) Prior Publication Data

US 2023/0052693 A1    Feb. 16, 2023

Related U.S. Application Data

(63) Continuation of application No. PCT/KR2022/011896, filed on Aug. 10, 2022.

(30) Foreign Application Priority Data

Aug. 13, 2021  (KR) .................. 10-2021-0107015

(51) Int. Cl.
  *H02J 50/60*    (2016.01)
  *G01R 19/165*   (2006.01)
  (Continued)

(52) U.S. Cl.
  CPC ........ *H02J 50/60* (2016.02); *G01R 19/16576* (2013.01); *H02J 7/0048* (2020.01);
  (Continued)

(58) Field of Classification Search
  CPC ............. H02J 50/60; H02J 50/80; H02J 50/12
  USPC ........................................................ 320/108
  See application file for complete search history.

(56) References Cited

U.S. PATENT DOCUMENTS 9,530,558 B2   12/2016  Nakano et al.
10,804,749 B2 *  10/2020  Lee .................. H02J 50/12
(Continued)

FOREIGN PATENT DOCUMENTS

KR   10-2018-0002206 A   1/2018
KR      10-1807335 B1    1/2018
(Continued)

OTHER PUBLICATIONS

International Search Report dated Nov. 15, 2022.

*Primary Examiner* — Nathaniel R Pelton
(74) *Attorney, Agent, or Firm* — Cha & Reiter LLC

(57) ABSTRACT

An electronic device and method are disclosed. The electronic device includes: a battery, a wireless power transfer (WPT) coil, wireless power transceiver circuitry, a charging circuit, and a processor electrically connected to the wireless power transceiver circuitry and the charging circuit. The processor implements the method, including: receiving first detecting power from an external electronic device, determining whether a reception voltage generated by the received first detecting power is higher than a first predetermined voltage value, based on detecting that the reception voltage is higher than the first predetermined voltage value, supplying power from the battery to the wireless power transceiver circuitry, outputting via the WPT coil, foreign object detecting power based on the supplied power, and based on detecting an electrical change in the foreign object detecting power caused by presence of a foreign object, determining that an error has occurred.

20 Claims, 13 Drawing Sheets

(51) Int. Cl.
  *H02J 7/00*    (2006.01)
  *H02J 50/12*   (2016.01)
  *H02J 50/80*   (2016.01)
  *H02M 7/219*   (2006.01)

(52) U.S. Cl.
  CPC .......... *H02J 7/00712* (2020.01); *H02J 50/12* (2016.02); *H02J 50/80* (2016.02); *H02J 2207/20* (2020.01); *H02M 7/219* (2013.01)

(56) References Cited

U.S. PATENT DOCUMENTS

| | | | |
|---|---|---|---|
| 11,043,331 B2* | 6/2021 | Arisawa | H02J 50/80 |
| 2014/0113689 A1 | 4/2014 | Lee | |
| 2015/0244176 A1* | 8/2015 | Van Den Brink | H04B 5/266 |
| | | | 307/104 |
| 2016/0268845 A1 | 9/2016 | Wang et al. | |
| 2018/0123379 A1* | 5/2018 | Ha | H02J 7/342 |
| 2019/0190320 A1 | 6/2019 | Park | |
| 2021/0083526 A1* | 3/2021 | Bhat | H02J 50/60 |
| 2021/0203193 A1* | 7/2021 | Kim | H02J 50/80 |

FOREIGN PATENT DOCUMENTS

| | | |
|---|---|---|
| KR | 10-2018-0022513 A | 3/2018 |
| KR | 10-2018-0047800 A | 5/2018 |
| KR | 10-2018-0106217 A | 10/2018 |
| KR | 10-2021-0086589 A | 7/2021 |
| WO | 2014/039088 A1 | 3/2014 |
| WO | 2020/036357 A1 | 2/2020 |

\* cited by examiner

METHOD OF DETECTING FOREIGN OBJECT AND ELECTRONIC DEVICE

CROSS-REFERENCE TO RELATED APPLICATION(S)

This application is a continuation of International Application No. PCT/KR2022/011896, which was filed on Aug. 10, 2022, and claims priority to Korean Patent Application No. 10-2021-0107015, filed on Aug. 13, 2021, in the Korean Intellectual Property Office, the disclosures of which are incorporated by reference herein their entirety.

TECHNICAL FIELD

Certain embodiments of the disclosure relate to wireless charging, and more particularly, to detecting intrusion of foreign objects interfering with wireless charging.

BACKGROUND

An electronic device may be wirelessly charged or may be charged in a contactless way using a wireless power transfer technology. The wireless power transfer technology may be a technology in which a battery of a power reception device is charged through the wireless transfer of power from a power transmission device to the power reception device, without a physical connection between the power reception device and the power transmission device (e.g., without a separate connector). The wireless power transfer technology may include a magnetic induction method and a magnetic resonance method.

When power is wirelessly transceived between electronic devices, accidents may be caused by intrusion of foreign objects which may hinder power transmission. However, an issue arises in that a consistent level of safety cannot be effected, because the methods of detecting such foreign objects depends upon the performance of a transmitting device typically responsible for said detection.

SUMMARY

In some embodiments of this disclosure, an electronic device and method are disclosed, which enable a receptive electronic device to detect intrusion of a foreign object prior to receiving wireless power.

In some embodiments of this disclosure, an electronic device is disclosed, including: a battery; a wireless power transfer (WPT) coil; wireless power transceiver circuitry electrically connected to the WPT coil, and configured to wirelessly receive power and/or wirelessly transmit power; a charging circuit electrically connected to the wireless power transceiver circuitry and the battery; and a processor electrically connected to the wireless power transceiver circuitry and the charging circuit, wherein the processor is configured to: receive first detecting power from an external electronic device, when the wireless power transceiver circuitry is operating in a reception mode, determine whether a reception voltage generated by the received first detecting power is higher than a first predetermined voltage value, based on detecting that the reception voltage is higher than the first predetermined voltage value, control the charging circuit to supply power from the battery to the wireless power transceiver circuitry, output, via the WPT coil, foreign object detecting power based on the supplied power, and based on detecting an electrical change in the foreign object detecting power caused by presence of a foreign object, determine that an error has occurred.

In some embodiments of this disclosure, a method is disclosed for an electronic device, including: receiving, via wireless power transceiver circuitry, first detecting power from an external electronic device, when the wireless power transceiver circuitry is operating in a reception mode, determine, via a processor, whether a reception voltage generated by the received first detecting power is higher than a first predetermined voltage value, based on detecting that the reception voltage is higher than the first predetermined voltage value, supplying power, via a charging circuit, from the battery to the wireless power transceiver circuitry, outputting, via a wireless power transfer (WPT) coil, foreign object detecting power based on the supplied power, and based on detecting an electrical change in the foreign object detecting power caused by presence of a foreign object, determine, via the processor, that an error has occurred.

The electronic device and method disclosed herein may detect intrusion of foreign objects into a wireless charging context, so as to prevent accidents caused by said intrusion, prior to initiation of a wireless charging operation.

The electronic device and method disclosed herein improve the safety of wireless power transmission and reception, as detection of the foreign object is no longer dependent solely on the detection performance of the power transmitting device.

BRIEF DESCRIPTION OF DRAWINGS

In relation to the description of the drawings, the same or similar reference numerals may be used with respect to the same or similar constituent elements, in which in which.

DETAILED DESCRIPTION

Figure 1:
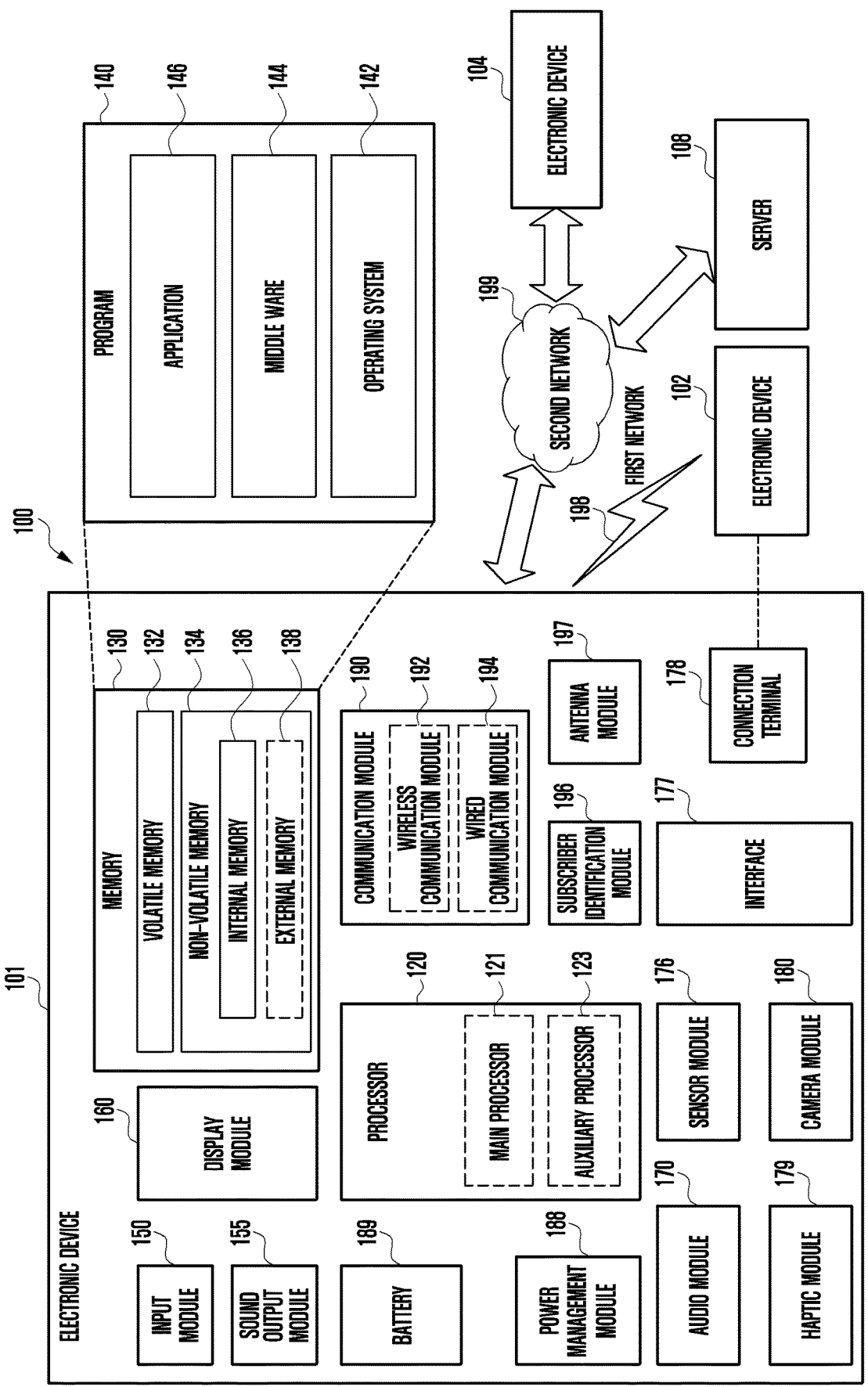
FIG. 1 is a block diagram of an electronic device within a network environment according to certain embodiments of the disclosure.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related therertto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
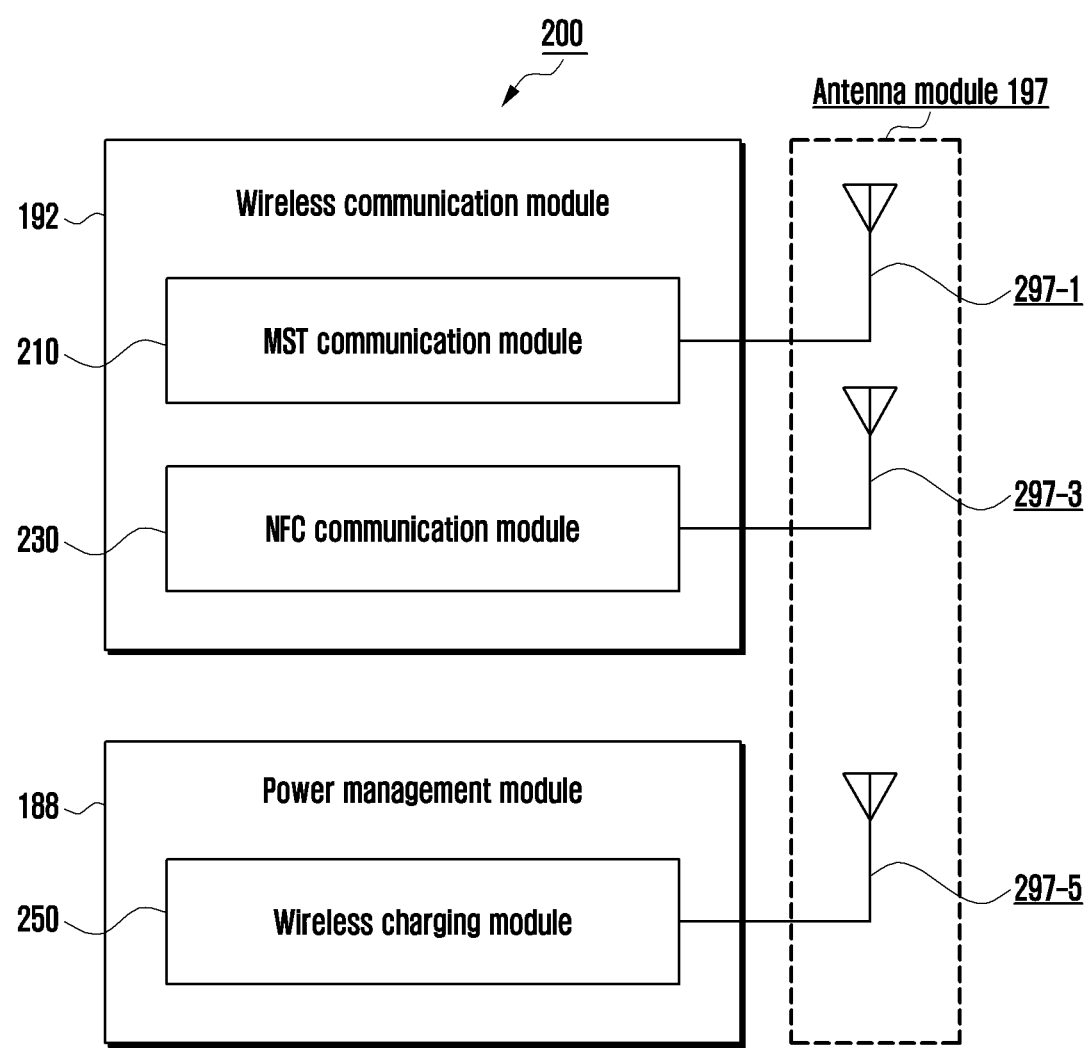
FIG. 2 is a block diagram of a wireless communication module, power management module, and antenna module of an electronic device according to certain embodiments of the disclosure.

FIG. 2 is a block diagram 200 of the wireless communication module 192, power management module 188, and antenna module 197 of the electronic device 101 according to certain embodiments.

With reference to FIG. 2, the wireless communication module 192 may include an MST communication module 210 or an NEC communication module 230, and the power management module 188 may include a wireless charging module 250. In such a case, the antenna module 297 may include a plurality of antennas including an MST antenna 297-1 connected to the MST communication module 210, an NFC antenna 297-3 connected to the NFC communication module 230, and a wireless charging antenna 297-5 connected to the wireless charging module 250. For convenience of description, a component redundant with that of FIG. 1 is omitted or briefly described.

The MST communication module 210 may receive, from the processor 120, a signal including control information or payment information, such as card information, may generate a magnetic signal corresponding to the signal received through the MST antenna 297-1, and may deliver the generated magnetic signal to the external electronic device 102 (e.g., a POS device). In order to generate the magnetic signal, according to an embodiment, the MST communication module 210 may include a switching module (not illustrated) including one or more switches connected to the MST antenna 297-1, and may change a direction of a voltage or current supplied to the MST antenna 297-1 in response to the received signal by controlling the switching module. A change in the direction of the voltage or current enables a direction of a magnetic signal (e.g., a magnetic field) transmitted through the MST antenna 297-1 to be changed in response thereto. When the magnetic signal having the changed direction is detected by the external electronic device 102, an effect (e.g., a waveform) similar to a magnetic field generated as a magnetic card corresponding to the received signal (e.g., card information) is swiped by a card reader of the electronic device 102 may be caused. According to an embodiment, payment-related information received in the form of the magnetic signal by the electronic device 102 and a control signal may be transmitted to the external server 108 (e.g., a payment server) over the network 199, for example.

The NFC communication module 230 may obtain, from the processor 120, a signal including control information or payment information, such as card information, and may transmit the obtained signal to the external electronic device 102 through the NFC antenna 297-3. According to an embodiment, the NFC communication module 230 may receive, from the external electronic device 102, such a transmitted signal through the NFC antenna 297-3.

The wireless charging module 250 may wirelessly transmit power to the external electronic device 102 (e.g., a mobile phone or a wearable device) through the wireless charging antenna 297-5, and/or may wirelessly receive power from the external electronic device 102 (e.g., a wireless charging device). The wireless charging module 250 may support one or more of various wireless charging methods including a magnetic resonance method or a magnetic induction method, for example.

According to an embodiment, some antennas of the MST antenna 297-1, the NFC antenna 297-3, or the wireless charging antenna 297-5 may share at least a part of a radiation unit. For example, the radiation unit of the MST antenna 297-1 may be used as the radiation unit of the NEC antenna 297-3 or the wireless charging antenna 297-5, and vice versa. In such a case, the antenna module 297 may include a switching circuit (not illustrated) configured to selectively connect (e.g., close) or separate (e.g., open) at least some of the antennas 297-1, 297-3, or 297-3 under the control of the wireless communication module 192 (e.g., the MST communication module 210 or the NFC communication module 230) or the power management module 188 (e.g., the wireless charging module 250). For example, if the electronic device 101 uses a wireless charging function, the NFC communication module 230 or the wireless charging module 250 may temporarily separate, from the NFC antenna 297-3, at least some area of the radiation unit shared by the NFC antenna 297-3 and the wireless charging antenna 297-5 and connect the at least some area to the wireless charging antenna 297-5 by controlling the switching circuit.

According to an embodiment, at least one function of the MST communication module 210, the NFC communication module 230, or the wireless charging module 250 may be controlled by an external processor (e.g., the processor 120). According to an embodiment, designated functions (e.g., the payment function) of the MST communication module 210 or the NFC communication module 230 may be performed in a trusted execution environment (TEE). The TEE according to certain embodiments may form an execution environment to which at least some designated area of the memory 130 is allocated in order for the TEE to be used to perform a function (e.g., a financial transactions or personal information-related function) that involves security having a relatively high level, for example. In such a case, access to the designated area may be limitedly permitted by being classified based on a subject that approaches the designated area or an application executed in the TEE, for example.

Figure 3:
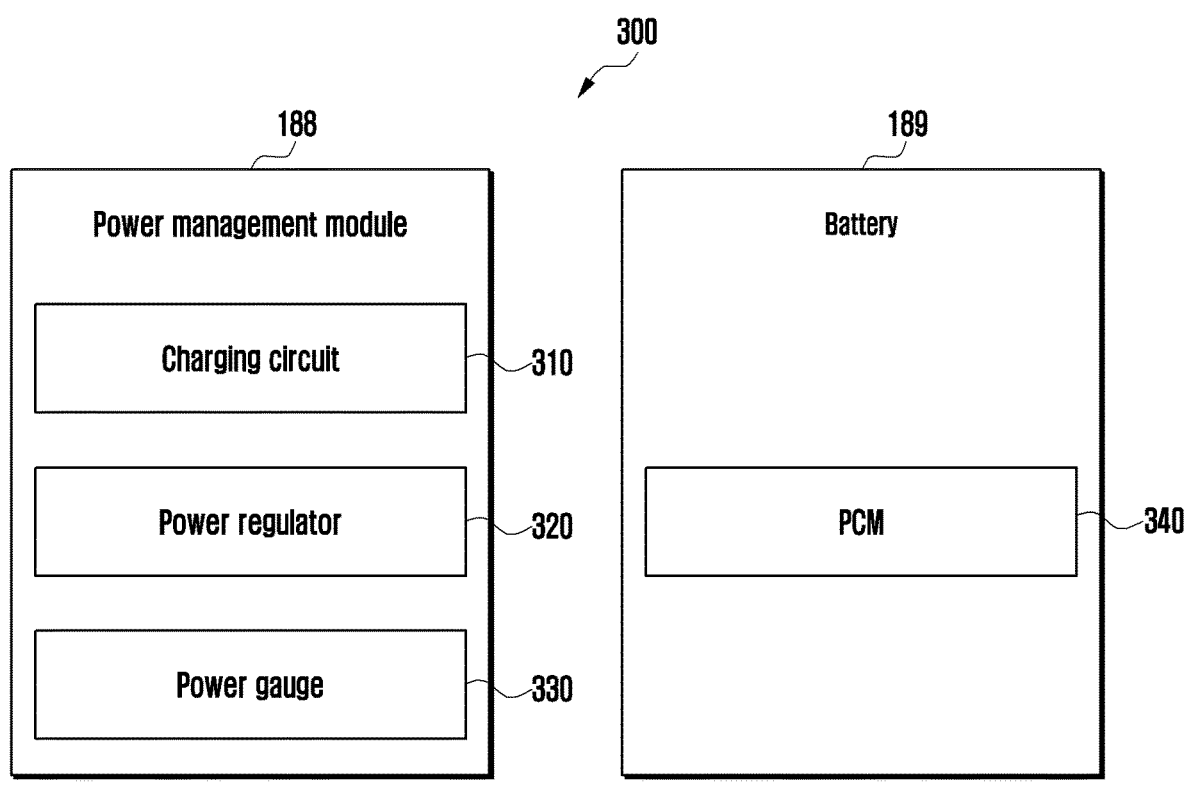
FIG. 3 is a block diagram of the power management module and a battery according to certain embodiments of the disclosure.

FIG. 3 is a block diagram 300 of the power management module 188 and the battery 189 according to certain embodiments of the disclosure.

With reference to FIG. 3, the power management module 188 may include a charging circuit 310, a power regulator 320, or a power gauge 330. The charging circuit 310 may charge the battery 189 by using power supplied from an external power source for the electronic device 101. According to an embodiment, the charging circuit 310 may select a charging method (e.g., normal charging or quick charging) based on at least some of the type (e.g., a power adaptor, a USB, or wireless charging) of external power source, the size of power (e.g., about 20 Watt or more) suppliable from an external power source, or an attribute of the battery 189, and may charge the battery 189 by using the selected charging method. The external power source may be connected to the electronic device 101 in a wired way through the connection terminal 178 or may be wirelessly connected to the electronic device 101 through the antenna module 197, for example.

The power regulator 320 may generate a plurality of pieces of power having different voltages or current levels by regulating a voltage level or current level of power supplied from an external power source or the battery 189, for example. The power regulator 320 may regulate power of the external power source or the battery 189 to a voltage or current level suitable for each of some components of the components included in the electronic device 101. According to an embodiment, the power regulator 320 may be implemented in the form of a low-dropout (LDO) regulator or a switching regulator. The power gauge 330 may measure usage state information for the battery 189 (e.g., a capacity, number of times that the battery is charged and discharged, voltage, or temperature of the battery 189).

The power management module 188 may determine charging state information (e.g., lifespan, an overvoltage, a low voltage, an overcurrent, overcharging, over-discharging, overheating, a short, or swelling) related to the charging of the battery 189 based on at least some of measured usage state information by using the charging circuit 310, the voltage regulator 320, or the power gauge 330, for example. The power management module 188 may determine whether the battery 189 is normal or abnormal based on at least some of the determined charging state information. When a state of the battery 189 is determined to be abnormal, the power management module 188 may regulate (e.g., reduce a charging current or voltage or stop charging) the charging of the battery 189. According to an embodiment, at least some of functions of the power management module 188 may be performed by an external control device (e.g., the processor 120).

According to an embodiment, the battery 189 may include a protection circuit module (PCM) 340. The protection circuit module 340 may perform one or more of various functions (e.g., pre-blocking functions) for preventing a reduction in performance of the battery 189 or damage to the battery 189. The protection circuit module 340 may be implemented as at least some of a battery management system (BMS) capable of performing various functions, including cell balancing, battery capacity measurement, battery charging and discharging number measurement, temperature measurement, or voltage measurement, additionally or alternatively.

According to an embodiment, at least some of usage state information or charging state information of the battery 189 may be measured by using a corresponding sensor (e.g., a temperature sensor) of the sensor module 176, the power gauge 330, or the power management module 188. According to an embodiment, the corresponding sensor (e.g., a temperature sensor) of the sensor module 176 may be included as a part of the protection circuit module 340 or may be disposed near the battery 189 as a device separated from the protection circuit module 340.

Figure 4A:
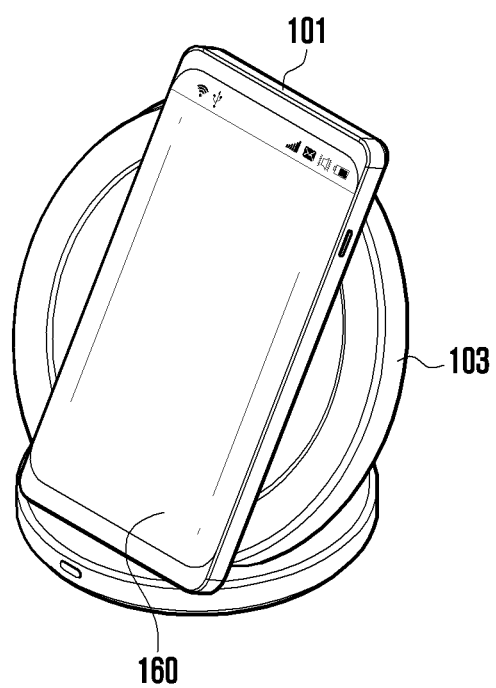
FIG. 4A is a diagram illustrating a wireless charging operation between the electronic device and a first external electronic device according to an embodiment of the disclosure.

FIG. 4A is a diagram illustrating a wireless charging operation between the electronic device 101 and a first external electronic device 103 according to an embodiment of the disclosure.

The electronic device 101 and the first external electronic device 103 may transmit and receive wireless power. For example, the electronic device 101 may be a power reception device, and the first external electronic device 103 may be a power transmission device. Each of the electronic device 101 and the first external electronic device 103 may transmit and receive power by using a wireless power transfer (WPT) coil (e.g., the wireless charging antenna 297-5) included therein. For example, the first external electronic device 103 may transmit power to the electronic device 101 by using the WPT coil, and the electronic device 101 may receive power from the first external electronic device 103 by using the WPT coil. For example, the electronic device 101 may be a smartphone, and the first external electronic device 103 may be a wireless charger.

Figure 4B:
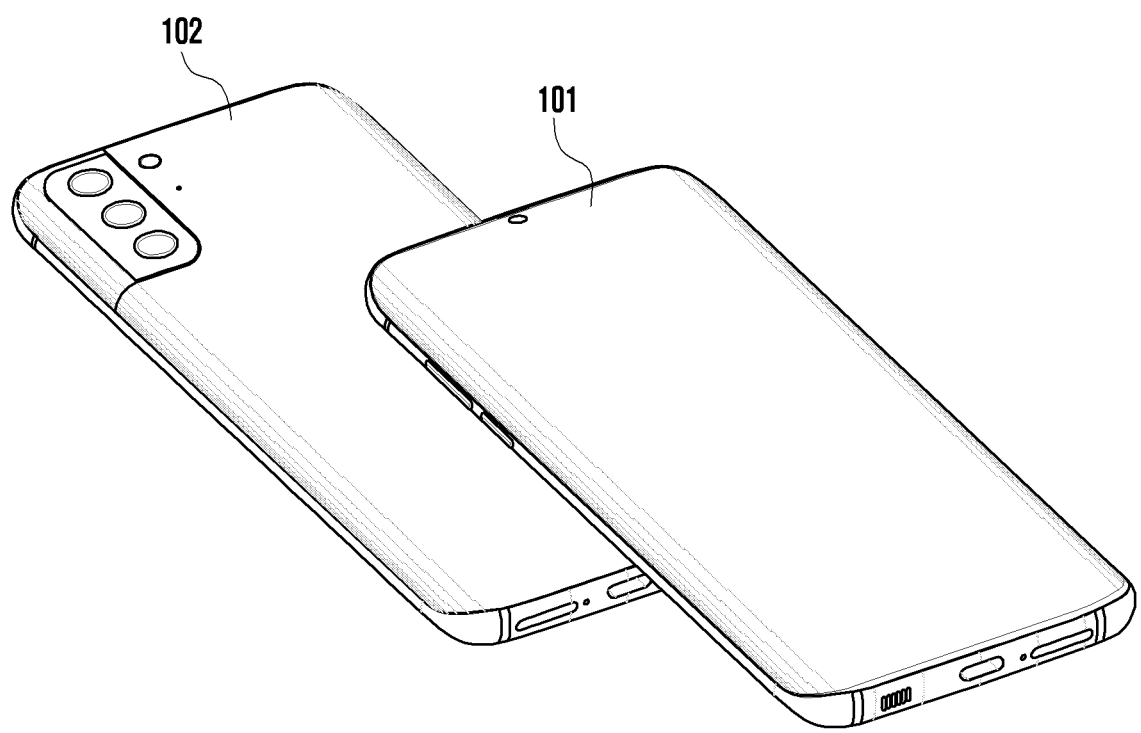
FIG. 4B is a diagram illustrating a wireless charging operation between electronic devices according to an embodiment of the disclosure.

FIG. 4B is a diagram illustrating a wireless charging operation between the electronic devices 101 and 102 according to an embodiment of the disclosure.

The electronic devices 101 and 102 may mutually transmit and receive wireless power. One (e.g., the electronic device 101) of the electronic devices 101 and 102 may be a power reception device, and one (e.g., the electronic device 102) of the electronic devices 101 and 102 may be a power transmission device. Each of the electronic devices 101 and 102 may transmit and receive power by using a wireless power transfer (WPT) coil (e.g., the wireless charging antenna 297-5) included therein.

Figure 4C:
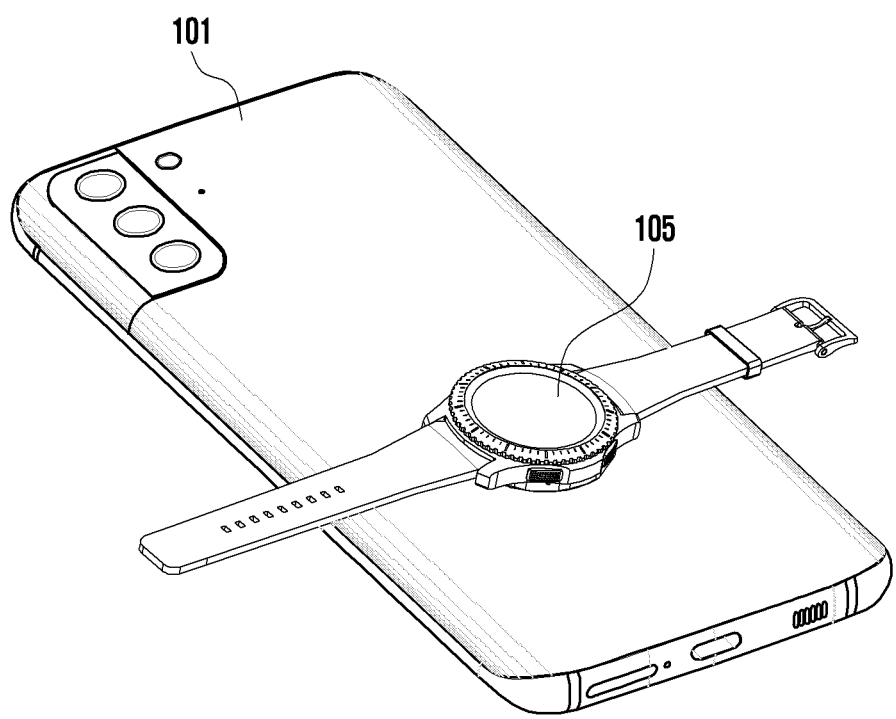
FIG. 4C is a diagram illustrating a wireless charging operation between the electronic device and a second external electronic device according to an embodiment of the disclosure.

FIG. 4C is a diagram illustrating a wireless charging operation between the electronic device 101 and a second external electronic device 105 according to an embodiment of the disclosure.

The electronic device 101 and the second external electronic device 105 may transmit and receive wireless power. The second external electronic device 105 may be a power reception device, and the electronic device 101 may be a power transmission device. Each of the electronic device 101 and the second external electronic device 105 may transmit and receive power by using a wireless power transfer (WPT) coil (e.g., the wireless charging antenna 297-5) included therein. For example, the electronic device 101 may transmit power to the second external electronic device 105 by using the WPT coil, and the second external electronic device 105 may receive power from the electronic device 101 by using the WPT coil. For example, the electronic device 101 may be a smartphone, and the second external electronic device 105 may be a wearable device or an ear bird.

Figure 5:
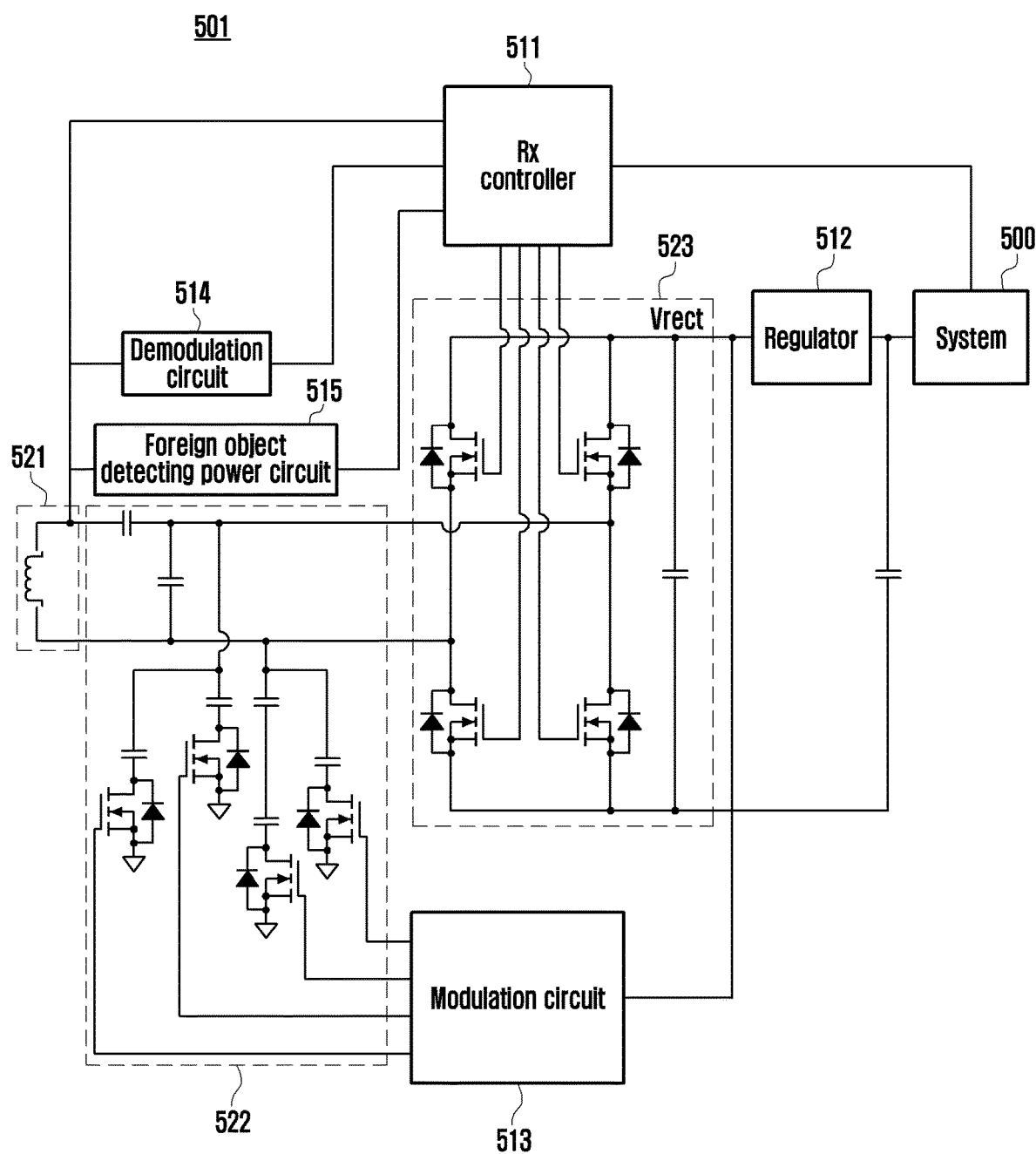
FIG. 5 is a diagram illustrating wireless power transceiver circuitry of the electronic device according to an embodiment of the disclosure.

FIG. 5 is a diagram illustrating an example of wireless power transceiver circuitry 501 of the electronic device 101 according to an embodiment of the disclosure.

The wireless power transceiver circuitry 501 may include a receive (RX) controller 511, a regulator 512, a modulation circuit 513, a demodulation circuit 514, a foreign object detecting power circuit 515, a wireless power transfer (WPT) coil 521, a switch circuit 522 and/or a rectifier circuit 523.

The wireless power transceiver circuitry 501 may be physically and electrically connected to a system 500 of the electronic device 101. The system 500 may be a component of the electronic device 101, and may include the processor 120 and/or the battery 189 included in the electronic device 101.

The wireless power transceiver circuitry 501 may be controlled by the processor 120 included in the system 500. The wireless power transceiver circuitry 501 may convert received power into DC power and transmit the DC power to the battery 189. In an embodiment, the wireless power transceiver circuitry 501 may convert, into AC power, power received from the battery 189, and may transmit the AC power to an external electronic device (e.g., the second external electronic device 105 in FIG. 4C) through the coil 521.

The RX controller 511 may convert, into DC power, AC power received from the WPT coil 521 and supply the DC power to the system 500 (e.g., the battery 189, and/or the processor 120) by controlling the rectifier circuit 523, under the control of the processor 120.

The RX controller 511 may convert, into AC power, DC power received from the battery 189 and transmit the AC power to an external electronic device (e.g., the second external electronic device 105) by using the WPT coil 521 by controlling the rectifier circuit 523, under the control of the processor 120.

The WPT coil 521 may transmit wireless power to an external electronic device (e.g., the first external electronic device 103) or receive wireless power from an external electronic device (e.g., the second external electronic device 105) based on an electromagnetic induction phenomenon.

The rectifier circuit 523 may include a plurality of switches and a plurality of diodes, and may convert AC power into DC power or convert DC power into AC power.

The rectifier circuit 523 may be a bridge rectifier using a plurality of switches and a plurality of diodes included therein.

The RX controller 511 may receive a packet from an external electronic device (e.g., the second external electronic device 105) through the WPT coil 521 by controlling the demodulation circuit 514, under the control of the processor 120.

When receiving the packet from an external electronic device (e.g., the second external electronic device 105), the RX controller 511 may control to transmit power to an external electronic device (e.g., the second external electronic device 105) through the WPT coil 521, under the control of the processor 120.

The RX controller 511 may control to transmit a detecting ping to an external electronic device (e.g., the first external electronic device 103) through the WPT coil 521, under the control of the processor 120. At this time, while the detecting ping is transmitted to the external electronic device (e.g., the first external electronic device 103) through the WPT coil 521, the foreign object detecting power circuit 515 may measure an attenuation waveform of power, a voltage or a current of the detecting ping, and may amplify the attenuation waveform.

In an embodiment, the RX controller 511 may control to transmit foreign object detecting power or a detecting ping to an external electronic device (e.g., the first external electronic device 103) through the WPT coil 521, under the control of the processor 120. The foreign object detecting power may be a detecting ping. At this time, while the foreign object detecting power (or the detecting ping) is transmitted to the external electronic device (e.g., the first external electronic device 103) through the WPT coil 521, the foreign object detecting power circuit 515 may measure an attenuation waveform of power, a voltage or a current of the foreign object detecting power (or the detecting ping), and may amplify the attenuation waveform.

The RX controller 511 may determine whether a foreign object is present in a wireless power transmission and reception path based on a change in an attenuation waveform received from the foreign object detecting power circuit 515 and detect a foreign object, under the control of the processor 120. The RX controller 511 may determine whether a foreign object is present in the wireless power transmission and reception path and detect a foreign object by analog-to-digital-converting the attenuation waveform received from the foreign object detecting power circuit 515 and measuring a change in the attenuation waveform, under the control of the processor 120. When an attenuation time of an attenuation waveform received from the foreign object detecting power circuit 515 is faster than a determined time, the RX controller 511 may determine that a foreign object is present under the control of the processor 120.

A method of detecting a foreign object by using foreign object detecting power (or a detecting ping) is called an analog ping or a Q ping.

The regulator 512 may be implemented in the form of a low-dropout (LDO) regulator or a switching regulator. The regulator 512 may generate a plurality of pieces of power having different voltages or current levels by regulating a voltage level or current level of power supplied from an external power source or the battery 189, for example. The regulator 512 may regulate power of the external power source or the battery 189 to a voltage or current level suitable for each of some components of the components included in the electronic device 101.

The modulation circuit 513 may create a packet based on the wireless power consortium (WPC) wireless charging technology standard, and may transmit the packet to an external electronic device (e.g., the first external electronic device 103 or the second external electronic device 105) through the WPT coil 521 by controlling the switch circuit 522.

The wireless power transceiver circuitry 501 may be in a standby state, and may receive DC power by rectifying AC power (e.g., a ping or detecting power) when the AC power having a wake-up level is induced from an external electronic device (e.g., the first external electronic device 103). When an AC or an AC voltage (e.g., a ping or detecting power) received from the external electronic device (e.g., the first external electronic device 103) is a determined current or determined voltage or more, the wireless power transceiver circuitry 501 may change impedance through the modulation circuit 513 by controlling the switch circuit 522. When impedance of the switch circuit 522 is changed, a binary signal is induced into the WPT coil 521. The binary signal may be called a packet. The packet may include a message or information to perform wireless power transmission and reception. When the electronic device 101 transmits a packet to an external electronic device (e.g., the first external electronic device 103), the external electronic device (e.g., the first external electronic device 103) that receives the packet may wirelessly supply power to the electronic device 101 by using an electromagnetic induction method.

The switch circuit 522 may include a plurality of capacitors and a plurality of switches. The switch circuit 513 may transmit a packet to the WPT coil 521 under the control of the modulation circuit 513.

Figure 6:
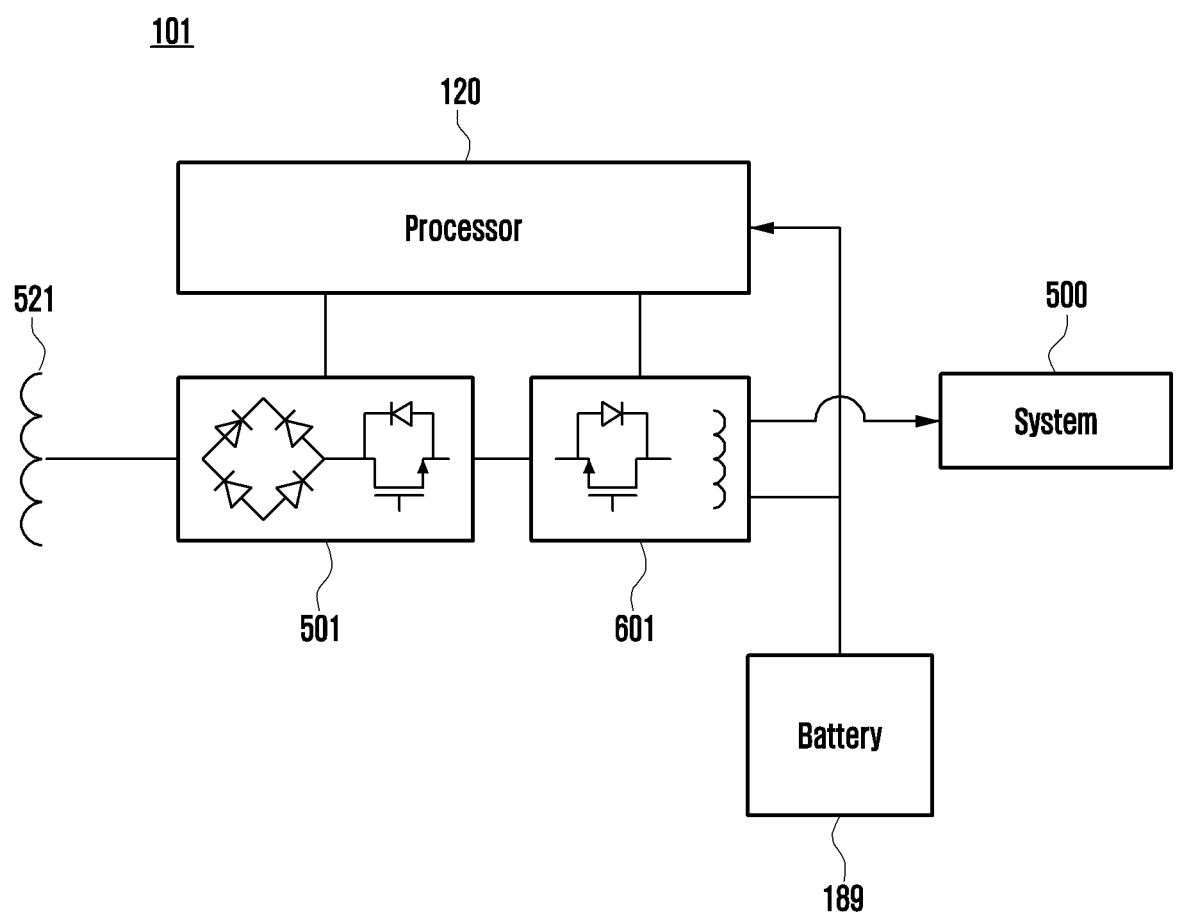
FIG. 6 is a block diagram illustrating an implementation of the electronic device according to an embodiment of the disclosure.

FIG. 6 is a block diagram illustrating an implementation of the electronic device 101 according to an embodiment of the disclosure.

The electronic device 101 may include the processor 120, the battery 189, the wireless power transceiver circuitry 501, the WPT coil 521 and/or a charging circuit 601 (e.g., the charging circuit 310 in FIG. 3).

The processor 120 may control operations of the battery 189, the wireless power transceiver circuitry 501 and/or the charging circuit 601.

The charging circuit 601 may supply power from the battery 189 to the wireless power transceiver circuitry 501 under the control of the processor 120.

When the battery 189 supplies power to the wireless power transceiver circuitry 501, the charging circuit 601 may deliver, to the wireless power transceiver circuitry 501, a voltage or current outputted by the battery 189 by boosting the voltage or current. The charging circuit 601 may include a boosting circuit for boosting a voltage outputted by the battery 189.

The wireless power transceiver circuitry 501 may generate foreign object detecting power (or a detecting ping) based on a voltage received from the charging circuit 601, and may transmit the foreign object detecting power (or a detecting ping) to an external electronic device (e.g., the first external electronic device 103) through the WPT coil 521.

When a rectifier circuit output voltage (e.g., Vrect in FIG. 5) generated by receiving detecting power from an external electronic device (e.g., the first external electronic device 103) is higher than a determined voltage, the wireless power transceiver circuitry 501 may generate foreign object detecting power (or a detecting ping) having a determined voltage based on a voltage received from the charging circuit 601. A voltage of foreign object detecting power (or a detecting ping) may be higher than a rectifier circuit output voltage (e.g., Vrect in FIG. 5) generated by receiving detecting power from an external electronic device (e.g., the first external electronic device 103).

When a voltage of foreign object detecting power (or a detecting ping) is higher than a rectifier circuit output voltage (e.g., Vrect in FIG. 5) generated by receiving detecting power from an external electronic device (e.g., the first external electronic device 103), the foreign object detecting power (or the detecting ping) may be transmitted to the external electronic device (e.g., the first external electronic device 103) through the WPT coil 521.

After transmitting foreign object detecting power (or a detecting ping) to an external electronic device (e.g., the first external electronic device 103), the wireless power transceiver circuitry 501 may measure an attenuation waveform of power, a voltage, or a current by using the foreign object detecting power circuit 515, and may amplify the attenuation waveform. After transmitting a detecting ping to an external electronic device (e.g., the first external electronic device 103), the wireless power transceiver circuitry 501 may determine whether a foreign object is present in a wireless power transmission and reception path by using the foreign object detecting power circuit 515.

The charging circuit 601 may charge the battery 189 by using power supplied from an external power source for the electronic device 101, under the control of the processor 120. According to an embodiment, the charging circuit 601 may select a charging method (e.g., normal charging or quick charging) based on at least some of the type (e.g., a power adaptor, a USB, or wireless charging) of external power source, the size of power suppliable from an external power source, or an attribute of the battery 189, and may charge the battery 189 by using the selected charging method. The external power source may be connected to the electronic device 101 in a wired way through the connection terminal 178 or may be wirelessly connected to the electronic device 101 through the WPT coil 521, for example.

The charging circuit 601 may deliver, to the system 500, power supplied from an external power source for the electronic device 101, under the control of the processor 120.

The wireless power transceiver circuitry 501 may convert, into AC power, DC power received from the charging circuit 601 and deliver the AC power to the WPT coil 521, under the control of the processor 120.

The wireless power transceiver circuitry 501 may convert, into DC power, AC power of an external electronic device (e.g., the first external electronic device 103) received from the WPT coil 521 and transmit the DC power to the charging circuit 601, under the control of the processor 120.

The WPT coil 521 may deliver, to an external electronic device (e.g., the second external electronic device 105), AC power received from the wireless power transceiver circuitry 501 based on an electromagnetic induction phenomenon.

The WPT coil 521 may deliver, to the wireless power transceiver circuitry 501, AC power received from an external electronic device (e.g., the first external electronic device 103) based on an electromagnetic induction phenomenon.

Figure 7:
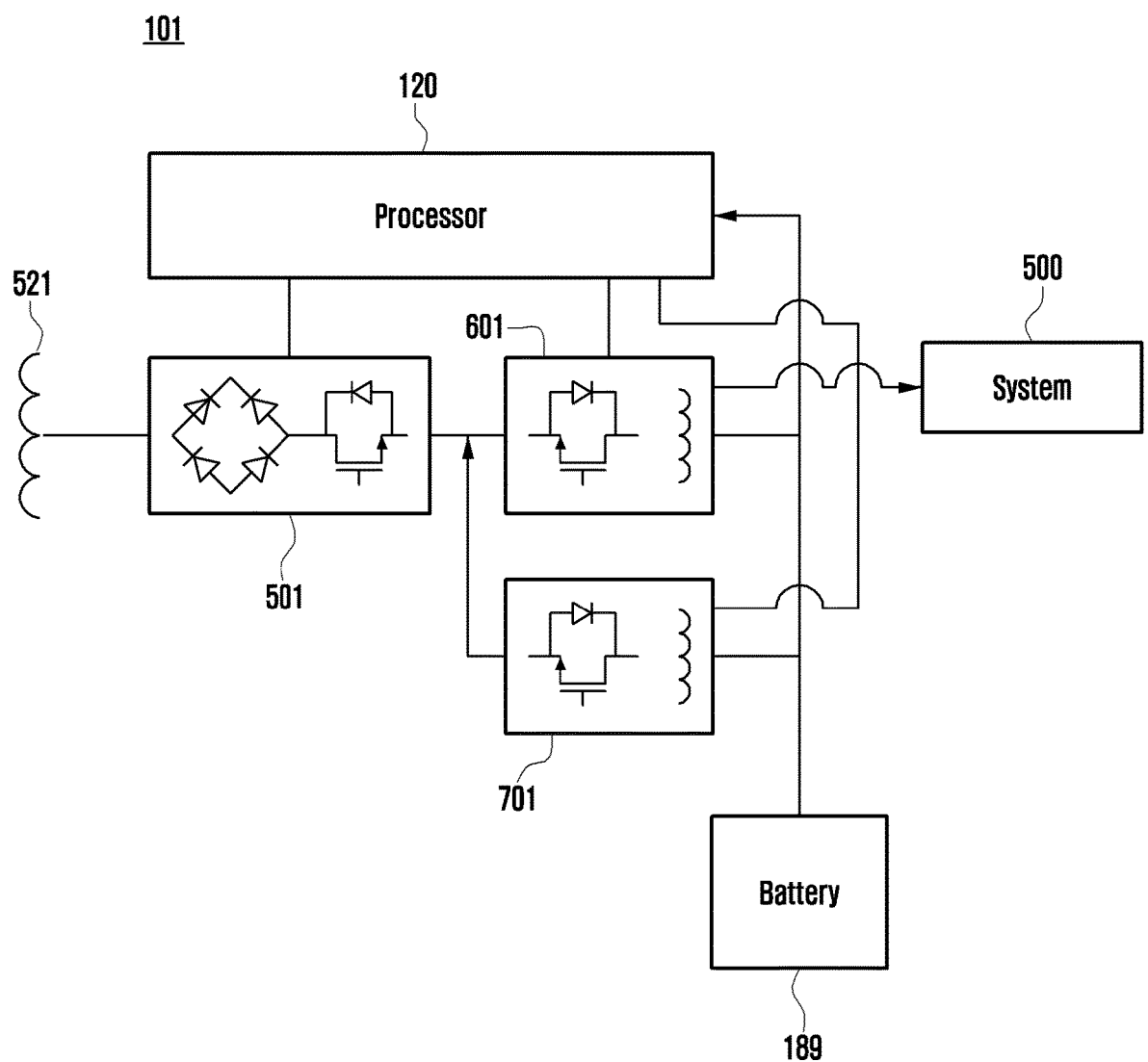
FIG. 7 is a block diagram illustrating an implementation of the electronic device according to an embodiment of the disclosure.

FIG. 7 is a block diagram illustrating an implementation of the electronic device 101 according to an embodiment of the disclosure.

The electronic device 101 may include the processor 120, the battery 189, the wireless power transceiver circuitry 501, the WPT coil 521, the charging circuit 601 (e.g., the charging circuit 310 in FIG. 3), and a voltage conversion circuit 701 (a DC to DC converter IC).

The processor 120 may control operations of the battery 189, the wireless power transceiver circuitry 501, the charging circuit 601 and/or the voltage conversion circuit 701.

The charging circuit 601 may charge the battery 189 by using power supplied from an external power source for the electronic device 101, under the control of the processor 120. According to an embodiment, the charging circuit 601 may select a charging method (e.g., normal charging or quick charging) based on at least some of the type (e.g., a power adaptor, a USB, or wireless charging) of external power source, the size of power suppliable from an external power source, or an attribute of the battery 189, and may charge the battery 189 by using the selected charging method. The external power source may be connected to the electronic device 101 in a wired way through the connection terminal 178 or may be wirelessly connected to the electronic device 101 through the WPT coil 521, for example.

The charging circuit 601 may deliver, to the system 500, power supplied from an external power source for the electronic device 101, under the control of the processor 120.

The voltage conversion circuit 701 may supply power from the battery 189 to the wireless power transceiver circuitry 501 under the control of the processor 120.

When the battery 189 supplies power to the wireless power transceiver circuitry 501, the voltage conversion circuit 701 may deliver, to the wireless power transceiver circuitry 501, a voltage outputted by the battery 189 by boosting the voltage. The voltage conversion circuit 701 may include a boosting circuit for boosting the voltage outputted by the battery 189.

The wireless power transceiver circuitry 501 may generate foreign object detecting power (or a detecting ping) based on a voltage received from the voltage conversion circuit 701, and may transmit the foreign object detecting power (or the detecting ping) to an external electronic device (e.g., the first external electronic device 103) through the WPT coil 521.

When a rectifier circuit output voltage (e.g., Vrect in FIG. 5) generated by receiving detecting power from an external electronic device (e.g., the first external electronic device 103) is higher than a determined voltage, the wireless power transceiver circuitry 501 may generate foreign object detecting power (or a detecting ping) having a determined voltage based on a voltage received from the voltage conversion circuit 701. A voltage of foreign object detecting power (or a detecting ping) may be higher than a rectifier circuit output voltage (e.g., Vrect in FIG. 5) generated by receiving a ping from an external electronic device (e.g., the first external electronic device 103).

When a voltage of foreign object detecting power (or a detecting ping) is higher than a rectifier circuit output voltage (e.g., Vrect in FIG. 5) generated by receiving a ping from an external electronic device (e.g., the first external electronic device 103), the foreign object detecting power (or the detecting ping) may be transmitted to the external electronic device (e.g., the first external electronic device 103) through the WPT coil 521.

After transmitting foreign object detecting power (or a detecting ping) to an external electronic device (e.g., the first external electronic device 103), the wireless power transceiver circuitry 501 may measure an attenuation waveform of power, a voltage, or a current by using the foreign object detecting power circuit 515, and may amplify the attenuation waveform. After transmitting the foreign object detecting power (or the detecting ping) to the external electronic device (e.g., the first external electronic device 103), the wireless power transceiver circuitry 501 may determine whether a foreign object is present in a wireless power transmission and reception path by using the foreign object detecting power circuit 515.

The wireless power transceiver circuitry 501 may convert, into AC power, DC power received from the voltage conversion circuit 701 and deliver the AC power to the WPT coil 521, under the control of the processor 120.

The wireless power transceiver circuitry 501 may convert, into DC power, AC power of an external electronic device (e.g., the first external electronic device 103) received from the WPT coil 521 and deliver the DC power to the charging circuit 601, under the control of the processor 120.

The WPT coil 521 may deliver, to an external electronic device (e.g., the first external electronic device 103), AC power received from the wireless power transceiver circuitry 501 based on an electromagnetic induction phenomenon.

The WPT coil 521 may deliver, to the wireless power transceiver circuitry 501, AC power received from an external electronic device (e.g., the first external electronic device 103) based on an electromagnetic induction phenomenon.

Figure 8A:
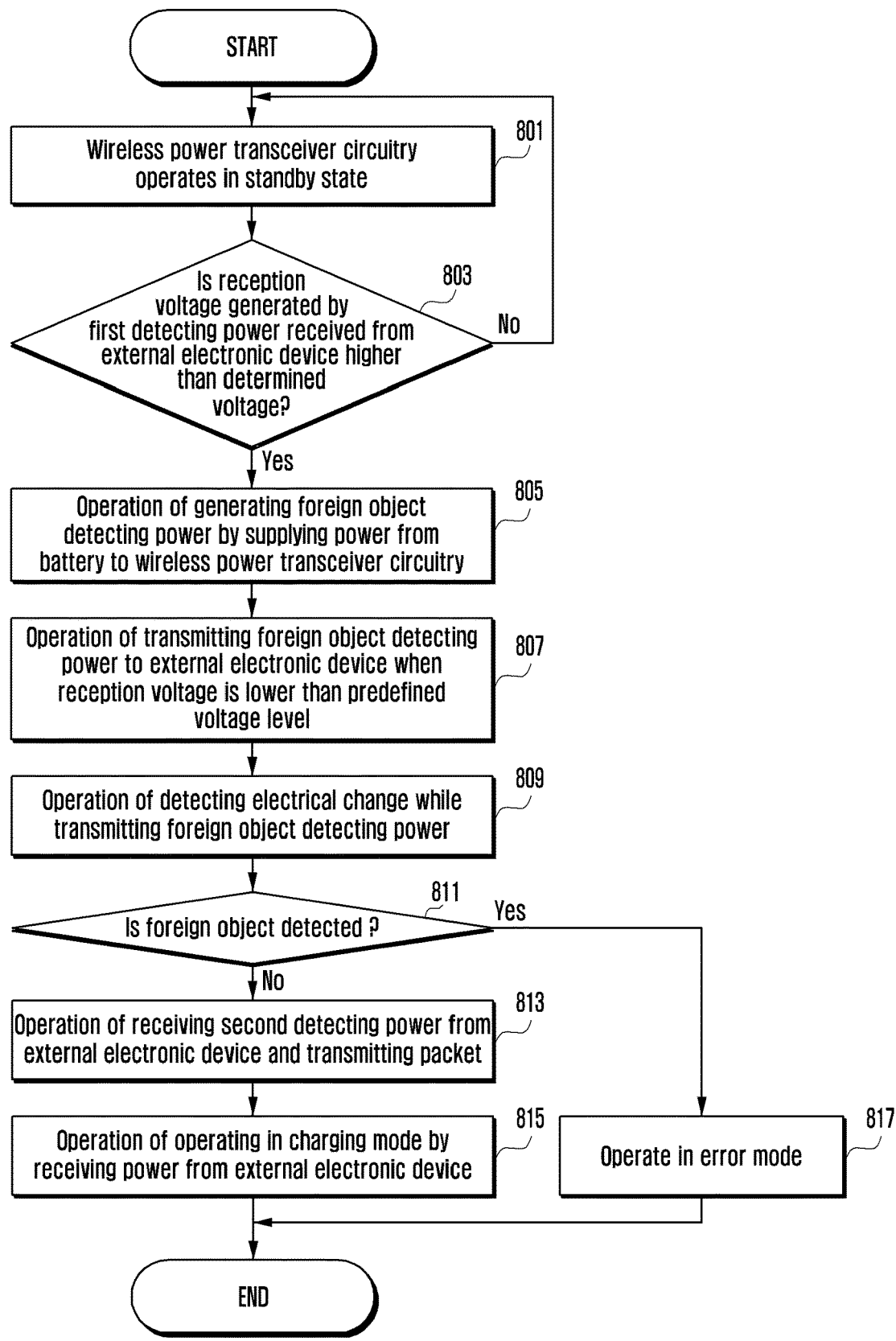
FIG. 8A is a flowchart illustrating a method of detecting, by the electronic device, a foreign object according to certain embodiments of the disclosure.

FIG. 8A is a flowchart illustrating an example method of detecting, by the electronic device 101, a foreign object according to certain embodiments of the disclosure.

In operation 801, the electronic device 101 may main operation of the wireless power transceiver circuitry 501 in a standby state, via control by the processor 120. The standby state may include a sleep mode or a shutdown state, for example.

In operation 803, the electronic device 101 may determine whether a reception voltage generated by first detecting power (e.g., a first ping) as received from an external electronic device is higher than a determined voltage (e.g., voltage level), via control by the processor 120.

In an embodiment, in operation 803, the electronic device 101 may determine whether the reception voltage is higher than a determined voltage, under the control of the processor 120.

The external electronic device 103 transmitting wireless power to the electronic device 101 may periodically generate AC power based on an input power source "Vin." The external electronic device 103 may induce a pulse into the WPT coil included in the external electronic device 103 for a predetermined time, based on the generated AC power. A "ping" may thus indicate inducing, by the external electronic device 103 transmitting wireless power, a pulse into the WPT coil included in the external electronic device 103 for a predetermined time based on an AC power source.

In an embodiment, the electronic device 101 may be seated in or electrically connected to the external electronic device 103 that is transmitting the wireless power. When the electronic device 101 is seated in the external electronic device 103, the electronic device 101 may receive a ping from the external electronic device 103, and may generate the reception voltage via the ping; that is, by an AC power source induced through the WPT coil 521.

In an embodiment, the electronic device 101 may be seated in or electrically connected to the external electronic device 103 transmitting the wireless power. When the electronic device 101 is seated in the external electronic device 103, the electronic device 101 may receive detecting power from the external electronic device 103, and may generate the reception voltage by the detecting power; that is, by an AC power source induced through the WPT coil 521.

The electronic device 101 may generate the reception voltage using the rectifier circuit 523, based on a ping induced through the WPT coil 521, under the control of the RX controller 511. The reception voltage may include an output voltage (e.g., "Vrect" in FIG. 5) of the rectifier circuit 523. The reception voltage may include a voltage generated by a ping first received from the external electronic device 103 by the electronic device 101 when the electronic device 101 is seated in the external electronic device 103, or a first ping.

The electronic device 101 may generate the reception voltage using the rectifier circuit 523 based on detecting power induced through the WPT coil 521, under the control of the RX controller 511. The reception voltage may include an output voltage (e.g., Vrect in FIG. 5) of the rectifier circuit 523. The reception voltage may include a voltage generated by first detecting power (or a first ping) first received from the external electronic device 103 by the electronic device 101 when the electronic device 101 is seated in the external electronic device 103.

When the reception voltage is higher than a predetermined voltage (e.g., a predetermined voltage value), the electronic device 101 may continue from operation 803 to operation 805 under the control of the processor 120.

When the reception voltage is lower than or equal to the determined voltage, the electronic device 101 may return to operation 801 from operation 803, under the control of the processor 120, and reperform operation of a standby state, as described earlier above.

In operation 805, the electronic device 101 may generate foreign object detecting power (or a detecting ping) by supplying power from the battery 189 to the wireless power transceiver circuitry 501, under the control of the processor 120.

In an embodiment, when the battery 189 supplies power to the wireless power transceiver circuitry 501, the charging circuit 601 may deliver, to the wireless power transceiver circuitry 501, a voltage or current output by the battery 189 by increasing the voltage or current, via control by the processor 120. When a rectifier circuit output voltage (e.g., Vrect in FIG. 5) generated by receiving detecting power (e.g., or a ping) from an external electronic device (e.g., the first external electronic device 103) is higher than a predetermined voltage value, the wireless power transceiver circuitry 501 may generate the foreign object detecting power (e.g., or a detecting ping) having a predetermined voltage based on a voltage received from the charging circuit 601, under the control of the processor 120.

In an embodiment, when the battery 189 supplies power to the wireless power transceiver circuitry 501, the voltage conversion circuit 701 may deliver, to the wireless power transceiver circuitry 501, a voltage output by the battery 189 by increasing the voltage, under the control of the processor 120. When a rectifier circuit output voltage (e.g., Vrect in FIG. 5) generated by receiving detecting power (or a ping) from an external electronic device (e.g., the first external electronic device 103) is higher than a predetermined voltage value, the wireless power transceiver circuitry 501 may generate the foreign object detecting power (or a detecting ping) having a predetermined voltage based on a voltage received from the voltage conversion circuit 701, under the control of the processor 120.

In operation 807, when the reception voltage is lower than a predefined voltage level, the electronic device 101 may transmit foreign object detecting power (e.g., or a detecting ping) to the external electronic device 103 by using the WPT coil 521, under the control of the processor 120.

In an embodiment, in operation 807, the electronic device 101 may determine whether the reception voltage is lower than the predefined voltage level, under the control of the processor 120.

When the reception voltage is lower than the predefined voltage level, the electronic device 101 may transmit the foreign object detecting power (e.g., or a detecting ping) to the external electronic device 103 using the WPT coil 521.

If the reception voltage is higher than or equal to the predefined voltage level, the electronic device 101 may transmit the foreign object detecting power (or the detecting ping) to the external electronic device 103 using the WPT coil 521, after the reception voltage is reduced to less than the predefined voltage level after a lapse of a given time, under the control of the processor 120. In the state in which the reception voltage is higher than or equal to the predefined voltage level, if the electronic device 101 transmits foreign object detecting power (e.g., or a detecting ping) to the external electronic device 103 using the WPT coil 521, an error may occur with respect to the foreign object detection operation, because an attenuation waveform of the foreign object detecting power (e.g., or the detecting ping) is measured in the state in which a voltage of the wireless power transceiver circuitry 501 has not sufficiently converged on 0. Accordingly, in order to prevent errors in the foreign object detection operation, when a reception voltage is lower than a predefined voltage level, the electronic device 101 may transmit foreign object detecting power (e.g., or a detecting ping) to the external electronic device 103 using the WPT coil 521.

In an embodiment, when a reception voltage is higher than a predefined voltage level, and if the electronic device 101 transmits foreign object detecting power (e.g., or a detecting ping) to the first external electronic device 103, it may be difficult to measure an electrical change of the foreign object detecting power (e.g., or the detecting ping). Accordingly, when the reception voltage is lower than the predefined voltage level, the electronic device 101 may transmit the foreign object detecting power (e.g., or the detecting ping) to the first external electronic device 103.

In operation 809, the electronic device 101 may detect an electrical change while transmitting the foreign object detecting power (e.g., or the detecting ping) using the WPT coil 521, under the control of the processor 120.

In an embodiment, in operation 809, the electronic device 101 may detect (e.g., measure) a change in value for a voltage, a current and/or power as caused by electromagnetic induction in the wireless power transmission and reception path, measure an attenuation waveform while transmitting the foreign object detecting power (e.g., or the detecting ping) using the WPT coil 521 and recognize a change in value of a voltage, a current and/or power based on whether a foreign object is present by amplifying the changed value of the voltage, current and/or power or the attenuation waveform, and thereby identify a change in the attenuation waveform (e.g., an attenuation coefficient), under the control of the processor 120.

In an embodiment, in operation 809, the electronic device 101 may measure a change in value of the voltage, current and/or power occurring caused by electromagnetic induction in the wireless power transmission and reception path, or measure an attenuation waveform thereof while transmitting the foreign object detecting power (e.g., or a detecting ping) using the WPT coil 521, and measure an attenuation coefficient based on the measured attenuation waveform, under the control of the processor 120.

In an embodiment, in operation 809, the electronic device 101 may determine whether an external load (e.g., or an external foreign object) is present by detect (e.g., measuring) a change in the value of a voltage, a current and/or power that occurs due electromagnetic induction in a wireless power transmission and reception path, while transmitting the foreign object detecting power (e.g., the detecting ping) using the WPT coil 521, under the control of the processor 120.

In an embodiment, in operation 809, the electronic device 101 may determine that a foreign object is present in the wireless power transmission and reception path when the change in value of the voltage, current and/or power caused by electromagnetic induction is greater than or smaller than a predetermined change value for one or more of the voltage, current and/or power, under the control of the processor 120.

For example, when a foreign object (e.g., a conductor) is present in the wireless power transmission and reception path between the electronic device 101 and the first external electronic device 103, a value of the voltage, the current and/or power, due to an electromagnetic induction, may suddenly increase due to foreign object detecting power (e.g., a detecting ping). In operation 811, the electronic device 101 may detect the presence of the foreign object by measuring the change in value of the voltage, the current and/or the power while transmitting the foreign object detecting power (or the detecting ping) using the WPT coil 521, under the control of the processor 120.

In an embodiment, in operation 809, the electronic device 101 may determine a change in an external load (e.g., or an external foreign object) by measuring a change in an attenuation waveform which occurs because of electromagnetic induction in the wireless power transmission and reception path, while transmitting the foreign object detecting power (or the detecting ping) using the WPT coil 521, under the control of the processor 120.

In an embodiment, in operation 809, when an attenuation waveform and/or an attenuation coefficient is detected due to electromagnetic induction in the wireless power transmission and reception path while the foreign object detecting power (e.g., the detecting ping) is transmitted by using the WPT coil 521, and the attenuation waveform and/or coefficient is greater than or smaller than a predetermined attenuation waveform value and/or attenuation coefficient value, the electronic device 101 may determine that a foreign object is present in the wireless power transmission and reception path, under the control of the processor 120.

For example, the attenuation waveform may be determined by inductance "L" and capacitance "C" of a resonant frequency between the WPT coil 521 and resonant capacitor of the electronic device 101, and/or inductance L and capacitance C of a resonant frequency between the WPT coil and resonant capacitor of the first external electronic device 103. When a foreign object is present in the wireless power transmission and reception path, an attenuation coefficient may change because the resonant frequency is changed.

In operation 811, the electronic device 101 may determine whether the foreign object is present in the wireless power transmission and reception path by measuring an attenuation coefficient while transmitting the foreign object detecting power (e.g., the detecting ping) using the WPT coil 521, under the control of the processor 120.

In an embodiment, in operation 809, the electronic device 101 may determine whether an external load (e.g., an external foreign object) is present by measuring the change in the resonant curve (e.g., or the "Q" factor) occurring due to electromagnetic induction in the wireless power transmission and reception path caused by the foreign object, while transmitting the foreign object detecting power (e.g., the detecting ping) using the WPT coil 521, under the control of the processor 120. When a foreign object is present in the wireless power transmission and reception path, the Q factor may change, because the resonant curve is changed.

In operation 809, the electronic device 101 may determine that the foreign object is present in the wireless power transmission and reception path when the Q factor measured while the foreign object detecting power (e.g., the detecting ping) as transmitted via the WPT coil 521 is greater than or smaller than a predetermined Q factor, under the control of the processor 120.

In operation 809, the electronic device 101 may determine whether the foreign object is present in the wireless power transmission and reception path by measuring a Q factor while transmitting the foreign object detecting power (e.g., the detecting ping) by using the WPT coil 521, under the control of the processor 120.

In an embodiment, in operation 809, the electronic device 101 may measure a change in value of the voltage, current and/or power, or measure the attenuation waveform that occurs due to an electromagnetic induction in the wireless power transmission and reception path, by using the foreign object detecting power circuit 515 while transmitting the foreign object detecting power (e.g., the detecting ping) using the WPT coil 521, and may amplify the changed value or attenuation waveform of the voltage, the current and/or the power, under the control of the processor 120.

In an embodiment, in operation 809, the electronic device 101 may measure a change in value of the voltage, current and/or power occurring due to an electromagnetic induction in the wireless power transmission and reception path, or measure the attenuation waveform thereof using the foreign object detecting power circuit 515 while transmitting the foreign object detecting power (e.g., the detecting ping) using the WPT coil 521, and measure the attenuation coefficient based on the measured attenuation waveform, under the control of the processor 120.

In an embodiment, in operation 809, the electronic device 101 may determine whether the external load (e.g., an external foreign object) is present by measuring a change in value of the voltage, current and/or power that occurs due to an electromagnetic induction in the wireless power transmission and reception path as caused by the foreign object, using the foreign object detecting power circuit 515 while transmitting the foreign object detecting power (e.g., the detecting ping) using the WPT coil 521, under the control of the processor 120. When a foreign object (e.g., a conductor) is present in the wireless power transmission and reception path between the electronic device 101 and the first external electronic device 103, a change in the value of the voltage, current and/or power may occur due to electromagnetic induction, such as a sudden rise therein due to the foreign object detecting power (e.g., the detecting ping). In operation 809, the electronic device 101 may detect the foreign object by measuring the change in value of the voltage, current and/or power while transmitting the foreign object detecting power (e.g., the detecting ping) using the WPT coil 521, under the control of the processor 120.

In an embodiment, in operation 809, the electronic device 101 may determine a change in an external load (e.g., an external foreign object) by measuring a change in an attenuation waveform occurring caused by electromagnetic induction in the wireless power transmission and reception path by presence of a foreign object, using the foreign object detecting power circuit 515 while transmitting the foreign object detecting power (e.g., the detecting ping) using the WPT coil 521, under the control of the processor 120. The attenuation waveform may be determined by inductance L and capacitance C of a resonant frequency between the WPT coil and resonant capacitor of the first external electronic device 103. When a foreign object is disposed in the wireless power transmission and reception path, an attenuation coefficient may be changed because the resonant frequency is changed. In operation 811, the electronic device 101 may determine whether a foreign object is present in the wireless power transmission and reception path by measuring the attenuation coefficient while transmitting the foreign object detecting power (e.g., the detecting ping) using the WPT coil 521, under the control of the processor 120.

In an embodiment, in operation 809, the electronic device 101 may determine whether an external load (e.g., an external foreign object) is present by measuring a change in a resonant curve (or a Q factor) that occurs due to an electromagnetic induction phenomenon in the wireless power transmission and reception path using the foreign object detecting power circuit 515, while transmitting the foreign object detecting power (e.g., the detecting ping) using the WPT coil 521, under the control of the processor 120. When a foreign object is disposed in the wireless power transmission and reception path, the Q factor may be changed because the resonant curve is changed. In operation 811, the electronic device 101 may determine whether the foreign object is present in the wireless power transmission and reception path by measuring the Q factor while transmitting the foreign object detecting power (e.g., the detecting ping) using the WPT coil 521, under the control of the processor 120.

For example, if a foreign object includes metal or some other magnetic substance, and the foreign object is present in the wireless power transmission and reception path, the current flow may increase because impedance will be lowered. The electronic device 101 may measure the change in voltage, a current and/or power, or measure the attenuation waveform thereof in the wireless power transmission and reception path using the foreign object detecting power circuit 515, and amplify the changed value of a voltage, a current and/or power or the attenuation waveform, under the control of the processor 120.

In operation 811, the electronic device 101 may determine whether the foreign object has been detected in the wireless power transmission and reception path based on the detected electrical change, while transmitting the foreign object detecting power (e.g., the detecting ping) using the WPT coil 521, under the control of the processor 120.

In an embodiment, the electronic device 101 may transmit a sequence of discrete bursts of foreign object detecting power (e.g., multiple detecting pings), measure a changed value of a voltage, a current and/or power in a wireless power transmission and reception path based on the plurality of pieces of foreign object detecting power (e.g., detecting pings) or measure an attenuation waveform thereof, and determine whether a foreign object is detected in the path by amplifying the changed value of the voltage, the current and/or the power or the attenuation waveform, under the control of the processor 120.

If a foreign object is not present in the wireless power transmission and reception path or a foreign object is not detected, the electronic device 101 may branch from operation 811 to operation 813 under the control of the processor 120.

If the foreign object is present or the foreign object is detected in the wireless power transmission and reception path, the electronic device 101 may branch from operation 811 to operation 817 under the control of the processor 120.

In operation 813, the electronic device 101 may receive second detecting power (e.g., a second ping) from the external electronic device 103 and transmit a packet to the external electronic device 103, under the control of the processor 120. The packet may include a message or request to execute wireless power transmission and reception. The external electronic device 103 receiving packet may wirelessly supply power to the electronic device 101 using an electromagnetic induction method.

Foreign object detecting power (e.g., a detecting ping) may be transmitted from the electronic device 101 to the external electronic device 103 in a time between the first detecting power (i.e., the first ping) and the second detecting power (i.e., the second ping) received from the external electronic device 103 by the electronic device 101.

In the wireless power consortium (WPC) wireless charging technology standard, a minimum cycle of the transmission of detecting power (e.g., a ping) by a wireless power transmission device (e.g., the external electronic device 103) is limited to a predetermined standard time (e.g., 32 ms).

After being seated in the external electronic device 103, the electronic device 101 may receive the first detecting power (i.e., the first ping) from the external electronic device 103 for the first time. The electronic device 101 may transmit foreign object detecting power (i.e., or a detecting ping) to the external electronic device 103 within at least a determined time (e.g., 32 ms) after receiving the first detecting power (i.e., the first ping), under the control of the processor 120. For example, the foreign object detecting power (e.g., or the detecting ping) may be a short pulse signal within 10 ms.

In operation 815, the electronic device 101 may execute a charging mode by wirelessly receiving power from the external electronic device 103, under the control of the processor 120. When receiving, from the electronic device 101, a packet including a message or request to initiate wireless power transmission and reception, the external electronic device 103 may begin to transmit power to the electronic device 101.

When detecting the foreign object in the wireless power transmission and reception path in operation 813, in operation 817, the electronic device 101 may execute an error mode under the control of the processor 120.

In an embodiment, when detecting the foreign object in the wireless power transmission and reception path in operation 813, in operation 817, the electronic device 101 may execute the error mode under the control of the processor 120. In an embodiment, when executing the error mode in operation 817, the electronic device 101 may provide information indicating the presence of a foreign object through an output device (e.g., the display module 160 or the sound output module 155) so as to notify a user of the same, under the control of the processor 120.

In an embodiment, when operating in the error mode in operation 817, the electronic device 101 may visually display, on the display module 160, notification (e.g., a warning user interface) indicating the presence of a foreign object under the control of the processor 120.

In an embodiment, when operating in the error mode in operation 817, the electronic device 101 may visually display, through LED flickering, notification (e.g., a warning user interface) indicating the presence of a foreign object under the control of the processor 120.

In an embodiment, when operating in the error mode in operation 817, the electronic device 101 may tactilely output, as vibration of the haptic module 179, notification indicating the presence of a foreign object under the control of the processor 120.

In an embodiment, when operating in the error mode in operation 817, the electronic device 101 may acoustically output, through the sound output module 155, notification (e.g., a warning sound) indicating the presence of a foreign object under the control of the processor 120.

In an embodiment, when operating in the error mode in operation 817, the electronic device 101 may abstain from transmitting the packet to the external electronic device 103 for initiation of power transmission until the foreign object is removed, under the control of the processor 120. When the packet from the electronic device 101 is not received within a predesignated time, the external electronic device 103 may omit transmission of wireless power to the electronic device 101. In an embodiment, in order to determine whether the foreign object has yet been removed, the electronic device 101 may regularly transmit the foreign object detecting power (or a detecting ping) according to predetermined cycle (e.g., or determined time) when receiving detecting power (a ping) from the external electronic device 103, under the control of the processor 120.

In an embodiment, alternatively, when executing the error mode in operation 817, the electronic device 101 may transmit the packet to the external electronic device 103 and receive wireless power from the external electronic device 103 at a predetermined power level, under the control of the processor 120. Assuming that power transmitted from the external electronic device 103 to the electronic device 101 is at a first power level when the foreign object is not present, the predetermined power level here may be less than the first power level.

In an embodiment, when executing the error mode in operation 817, the electronic device 101 may transmit a packet to the external electronic device 103 and receive, from the external electronic device 103, power having the same level as that when the foreign object is not present, under the control of the processor 120. At this time, in order to prevent malfunctions such as ignitions or heat-damage to components, the electronic device 101 may periodically monitor charging state information (e.g., lifespan, an overvoltage, a low voltage, an overcurrent, overcharging, overdischarging, overheating, a short, or swelling) related to the charging of the battery 189 according to a predetermined cycle (or determined time), under the control of the power management module 188. The electronic device 101 may determine whether to maintain the charging operation from the external electronic device 103 or change a level of the received power based on the monitored charging state information of the battery 189, as reported by the power management module 188 by controlling the processor 120.

In an embodiment, when a temperature of the battery 189 in the charging state information of the battery 189 reported by the power management module 188 is higher than a predetermined temperature, the electronic device 101 may block reception of power from the external electronic device 103 under the control of the processor 120.

In an embodiment, when a temperature of the battery 189 in the charging state information of the battery 189 reported by the power management module 188 is higher than a predetermined temperature, the electronic device 101 may lower a level of power received from the external electronic device 103, under the control of the processor 120.

In an embodiment, when operating in the error mode in operation 817, the electronic device 101 may deliver, to the external electronic device 103, a message indicating the presence of the foreign object through the communication module 190 under the control of the processor 120. When receiving, from the electronic device 101, the message or request regarding the presence of a foreign object, the external electronic device 103 may output a message through a display and/or output a notification sound through a speaker so that a user is notified of the presence of the foreign object. In an embodiment, when receiving, from the electronic device 101, a message or information regarding the presence of a foreign object, the external electronic device 103 may generate a notification indicating the message an LED light, such as by a flickering pattern, so that a user is notified of the presence of the foreign object.

In an embodiment, when receiving, from the electronic device 101, a message or request regarding the presence of a foreign object, the external electronic device 103 may output a notification indicating the presence of the foreign object via vibration generated by the haptic actuator, so that a user is notified of the presence of the foreign object.

When receiving, from the electronic device 101, a message or request regarding the presence of a foreign object, the external electronic device 103 may lower, to predetermined power level, the wireless power level transmitted to the electronic device 101. If power transmitted from the external electronic device 103 to the electronic device 101 is at a first power level when the foreign object is not present, the predetermined power level may be smaller than the first power.

Figure 8B:
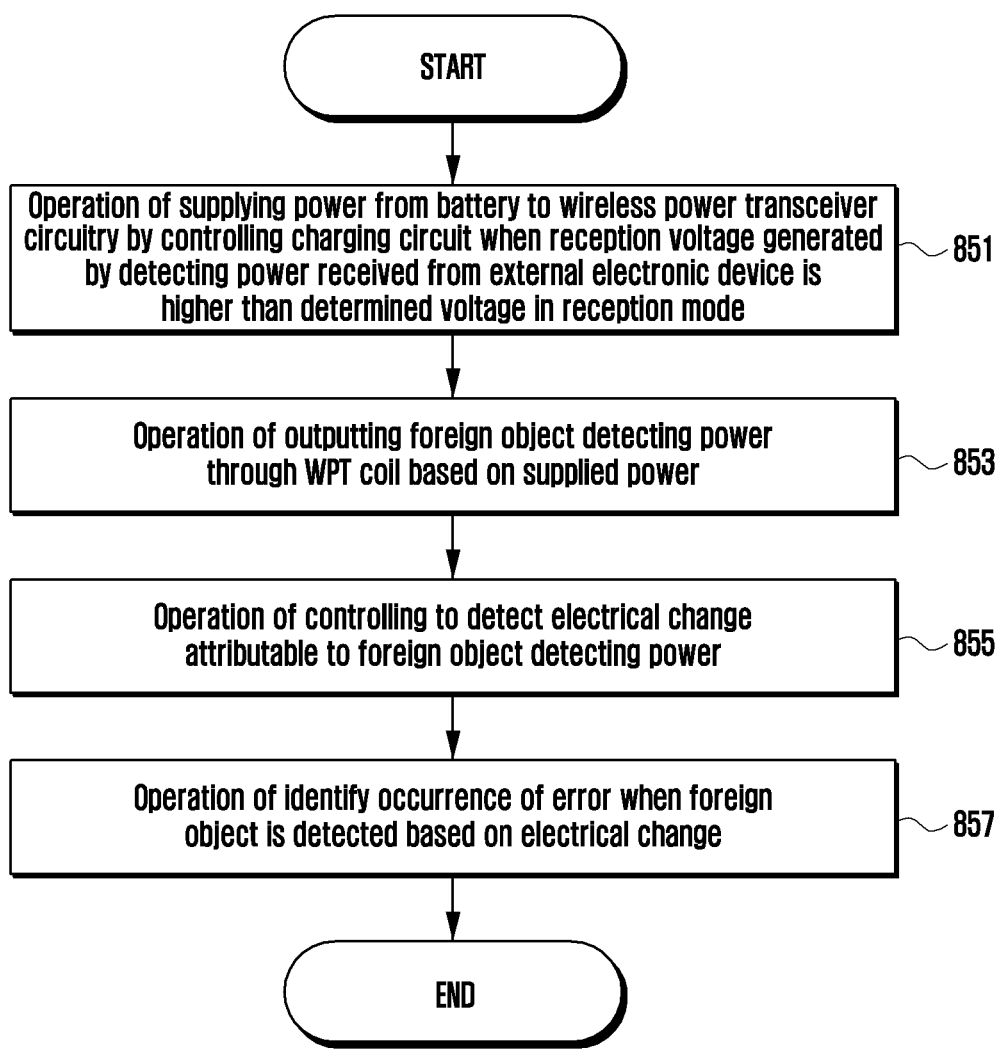
FIG. 8B is a flowchart illustrating a method of detecting, by the electronic device, a foreign object according to certain embodiments of the disclosure.

FIG. 8B is a flowchart illustrating a method of detecting, by the electronic device 101, a foreign object according to certain embodiments of the disclosure.

In operation 851, the electronic device 101 may control to supply power from the battery 189 to the wireless power transceiver circuitry 501 by controlling the charging circuit 310, 601 when a reception voltage generated by first detecting power as received from an external electronic device (e.g., the first external electronic device 103) is higher than a predetermined voltage level, when the wireless power transceiver circuitry 501 is in the reception mode, under the control of the processor 120.

In operation 853, the electronic device 101 may control to output the foreign object detecting power through the WPT coil 521 based on the supplied power, under the control of the processor 120.

In operation 855, the electronic device 101 may control to detect an electrical change caused by a presence of the foreign object, based on the foreign object detecting power, under the control of the processor 120.

In operation 857, the electronic device 101 may identify that an error occurs, when the foreign object is detected based on the electrical change, under the control of the processor 120.

Figure 9:
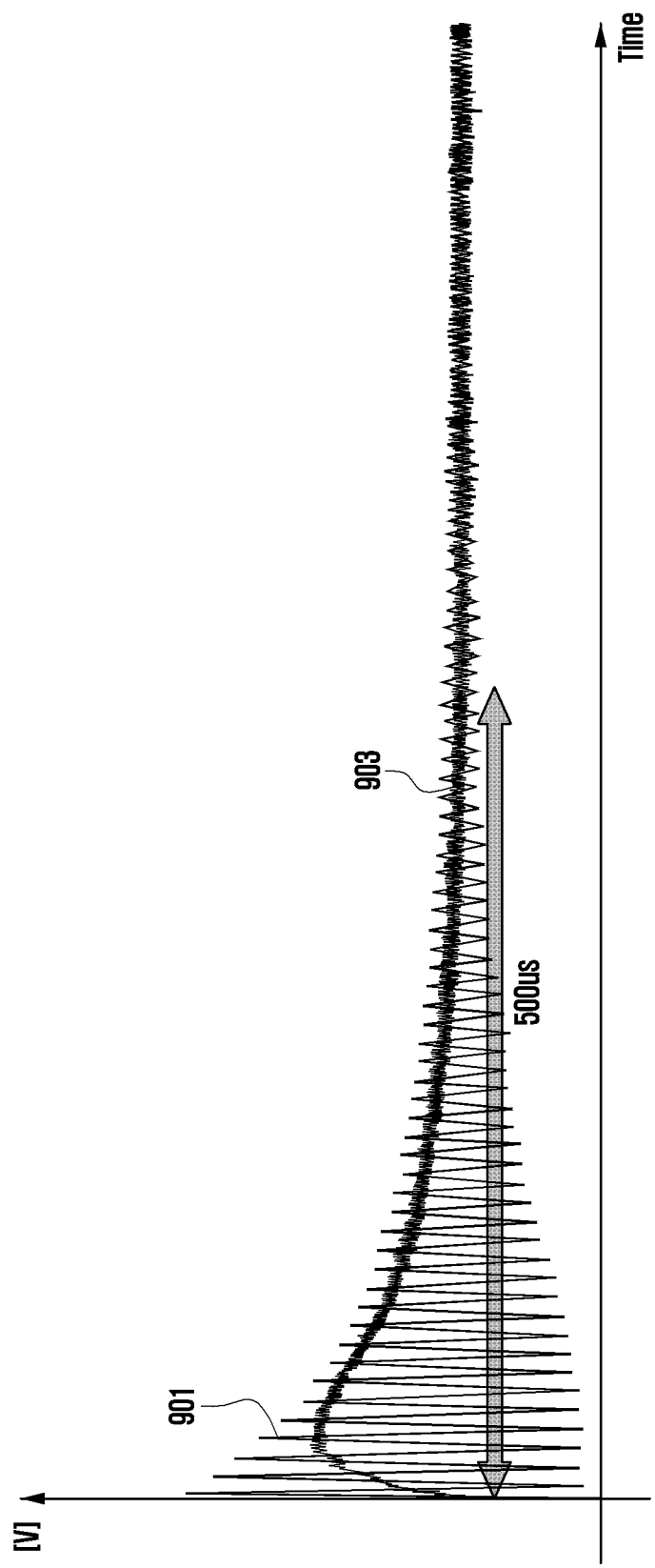
FIG. 9 is a graph illustrating a method of measuring an attenuation waveform after the electronic device transmits a detecting ping to the external electronic device according to an embodiment of the disclosure.

FIG. 9 is a graph illustrating a method of measuring an attenuation waveform after the electronic device 101 has transmitted foreign object detecting power (e.g., a detecting ping) to the external electronic device 103 according to an embodiment of the disclosure.

In FIG. 9, after transmitting foreign object detecting power (e.g., a detecting ping) to the external electronic device 103 based on the wireless power transceiver circuitry 501 and the WPT coil 521, the electronic device 101 may measure and amplify the attenuation waveform of the foreign object detecting power (e.g., the detecting ping) by using the foreign object detecting power circuit 515. The RX controller 511 may determine whether a foreign object is present in the wireless power transmission and reception path based on a change in the attenuation waveform received from the foreign object detecting power circuit 515, and may detect the foreign object, under the control of the processor 120. If an attenuation time for the attenuation waveform received from the foreign object detecting power circuit 515 is faster than a determined time, the RX controller 511 may determine that the foreign object is present, under the control of the processor 120.

The graph element 901 may represent an attenuation waveform of a detecting ping, and the graph element 903 may represent an envelope of foreign object detecting power (e.g., or a detecting ping). When an attenuation waveform or envelope of the foreign object detecting power (or a detecting ping) is faster than a determined time (e.g., 500 us), the electronic device 101 may determine that the foreign object is present, under the control of the processor 120.

According to an embodiment, the electronic device 101 may store, in a memory (e.g., the memory 130 in FIG. 1), an attenuation waveform of foreign object detecting power (or a detecting ping) and/or an envelope of the foreign object detecting power (or the detecting ping) when a foreign object is not present, and may compare attenuation waveforms and/or envelopes received when transmitting foreign object detecting power (or a detecting ping) for detecting a foreign object by comparison against the prestored waveforms and envelopes.

Figure 10:
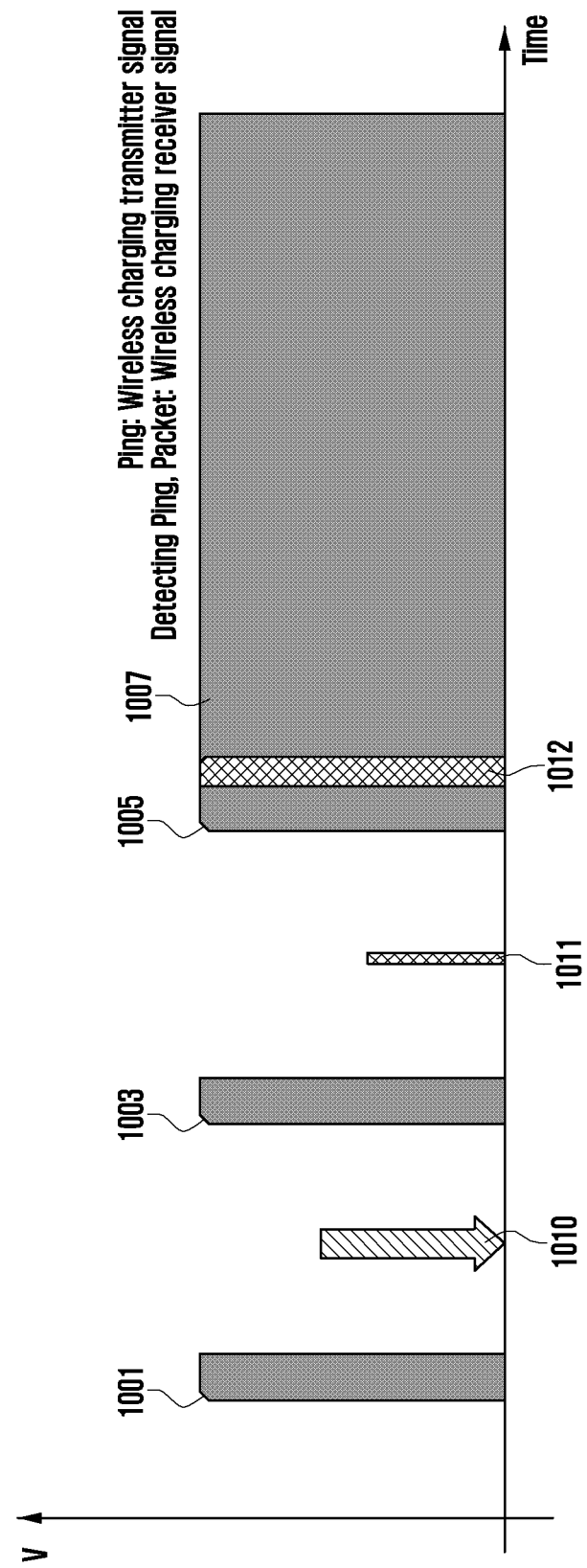
FIG. 10 is a graph illustrating a detecting ping transmission and charging operation of the electronic device according to an embodiment of the disclosure.

FIG. 10 is a graph illustrating foreign object detecting power (or a detecting ping) transmission and charging operation of the electronic device 101 according to an embodiment of the disclosure.

In FIG. 10, the external electronic device 103 may transmit detecting power (e.g., or pings 1001, 1003, and 1005) at determined time intervals. In a time 1010, the electronic device 101 may be seated in the external electronic device 103. The electronic device 101 may first detect the first detecting power (e.g., or the first detecting ping 1003) after the electronic device 101 is seated in the external electronic device 103 in order to receive wireless power.

Before the second detecting power (e.g., or the second detecting ping 1005) is reached after the first detecting power (or the first detecting ping 1003) is detected, the electronic device 101 may transmit foreign object detecting power (e.g., or detecting ping 1011) to the external electronic device 103, and may determine whether a foreign object is present by measuring changes in value of voltage, power or current of the foreign object detecting power (e.g., or detecting ping 1011), measurement of an attenuation waveform, or measurement an attenuation coefficient and/or a Q factor.

After determining that a foreign object is not present, when receiving the second detecting power (e.g., or the second detecting ping 1005), the electronic device 101 may transmit a packet 1012 to the external electronic device 103 requesting initiation of wireless power transmission. The external electronic device 103 that has received the packet may transmit wireless power 1007 to the electronic device 101.

The electronic device 101 according to certain embodiments may include the battery 189, the wireless power transfer (WPT) coil 521, the wireless power transceiver circuitry 501 electrically connected to the WPT coil 521 and wirelessly receiving power from an external electronic device (e.g., the first external electronic device 103) or wirelessly transmitting power to the outside, the charging circuit 310, 601 electrically connected to the wireless power transceiver circuitry 501 and the battery 189, and the processor 120 electrically connected to the wireless power transceiver circuitry 501 and the charging circuit 310, 601. The processor 120 may control to supply power from the battery 189 to the wireless power transceiver circuitry 501 by controlling the charging circuit 310, 601 when a reception voltage generated by first detecting power received from an external electronic device (e.g., the first external electronic device 103) is higher than a determined voltage when the wireless power transceiver circuitry 501 is in the reception mode, may control to output foreign object detecting power through the WPT coil 521 based on the supplied power, may control to detect an electrical change attributable to the foreign object detecting power, and may identify the occurrence of an error when a foreign object is detected based on the electrical change.

According to an embodiment, the electronic device 101 may further include the voltage conversion circuit 701. The processor 120 may control to generate the foreign object detecting power so that the power is supplied from the battery 189 to the wireless power transceiver circuitry 501 by controlling the charging circuit 310, 601 or the voltage conversion circuit 701 when the reception voltage generated by the first detecting power received from an external electronic device (e.g., the first external electronic device 103) is higher than the determined voltage, and may control to output the foreign object detecting power through the WPT coil 521 when the reception voltage is lower than a predefined voltage level.

According to an embodiment, the processor 120 may control to receive, from an external electronic device (e.g., the first external electronic device 103), second detecting power received after the foreign object detecting power is transmitted and may control to transmit a packet to an external electronic device (e.g., the first external electronic device 103), when a foreign object is not detected based on the electrical change attributable to the foreign object detecting power.

According to an embodiment, the processor 120 may control to operate in the charging mode by receiving power from an external electronic device (e.g., the first external electronic device 103).

According to an embodiment, the processor 120 may control the wireless power transceiver circuitry 501 to operate in the standby state when the reception voltage generated by the first detecting power received from an external electronic device (e.g., the first external electronic device 103) is lower than or equal to the determined voltage.

According to an embodiment, the processor 120 may measure a changed value of a voltage, a current and/or power occurring due to an electromagnetic induction phenomenon in a wireless power transmission and reception path or measure an attenuation waveform and an attenuation coefficient while transmitting the foreign object detecting power by using the WPT coil 521, and may determine that a foreign object is present in the wireless power transmission and reception path when the measured changed value of the voltage, the current and/or the power or the measured attenuation waveform and attenuation coefficient is greater than or smaller than a designated value.

According to an embodiment, the electronic device 101 further includes at least one of the display module 160, the sound output module 155, or the haptic module 179. The processor 120 may visually, acoustically, or tactilely output notification regarding the presence of the foreign object when the occurrence of the error is identified.

According to an embodiment, the processor 120 may not transmit a packet to an external electronic device (e.g., the first external electronic device 103) when the occurrence of the error is identified.

According to an embodiment, the processor 120 may control to receive wireless power as power lower than a determined power level when the occurrence of the error is identified.

According to an embodiment, the processor 120 may determine whether to maintain an operation of receiving wireless power from an external electronic device (e.g., the first external electronic device 103) or change a level of the received power based on charging state information of the battery 189 reported by the power management module when the occurrence of the error is identified.

According to an embodiment, the method of detecting, by the electronic device 101 transmitting and receiving wireless power, a foreign object may include an operation of controlling to supply power from the battery 189 to the wireless power transceiver circuitry 501 by controlling the charging circuit 310, 601 when a reception voltage generated by first detecting power received from an external electronic device (e.g., the first external electronic device 103) is higher than a determined voltage when the wireless power transceiver circuitry 501 is in a reception mode, an operation of controlling to output foreign object detecting power through the WPT coil 521 based on the supplied power, an operation of controlling to detect an electrical change attributable to the foreign object detecting power, and an operation of identifying the occurrence of an error when a foreign object is detected based on the electrical change.

According to an embodiment, the method of detecting, by the electronic device 101 transmitting and receiving wireless power, a foreign object may include an operation of controlling to generate the foreign object detecting power so that the power is supplied from the battery 189 to the wireless power transceiver circuitry 501 by controlling the charging circuit 310, 601 or the voltage conversion circuit 701 when the reception voltage generated by first detecting power received from an external electronic device (e.g., the first external electronic device 103) is higher than the determined voltage, and an operation of controlling to output the foreign object detecting power through the WPT coil 521 when the reception voltage is lower than the predefined voltage level.

According to an embodiment, the method of detecting, by the electronic device 101 transmitting and receiving wireless power, a foreign object may further include an operation of receiving, from an external electronic device (e.g., the first external electronic device 103), second detecting power received after the foreign object detecting power is transmitted when a foreign object is not detected based on the electrical change attributable to the foreign object detecting power and transmitting a packet to an external electronic device (e.g., the first external electronic device 103).

According to an embodiment, the method of detecting, by the electronic device 101 transmitting and receiving wireless power, a foreign object may further include an operation of performing a charging mode by receiving power from an external electronic device (e.g., the first external electronic device 103).

According to an embodiment, the method of detecting, by the electronic device 101 transmitting and receiving wireless power, a foreign object may further include an operation of performing the wireless power transceiver circuitry 501 in the standby state when the reception voltage generated by the first detecting power received from an external electronic device (e.g., the first external electronic device 103) is lower than or equal to the determined voltage.

According to an embodiment, the operation of controlling to detect the electrical change attributable to the foreign object detecting power may further include an operation of measuring a changed value of a voltage, a current and/or power occurring due to an electromagnetic induction phenomenon in a wireless power transmission and reception path or measuring an attenuation waveform and an attenuation coefficient while transmitting the foreign object detecting power by using the WPT coil 521, and determining that a foreign object is present in the wireless power transmission and reception path when the measured changed value of the voltage, the current and/or power or the measured attenuation waveform and attenuation coefficient is greater than or smaller than a designated value.

According to an embodiment, the operation of identifying the occurrence of an error may include visually, acoustically, or tactilely outputting notification regarding the presence of a foreign object when the foreign object is detected based on the electrical change.

According to an embodiment, the operation of identifying the occurrence of an error may include an operation of not transmitting a packet to an external electronic device (e.g., the first external electronic device 103) when the foreign object is detected based on the electrical change.

According to an embodiment, the operation of identifying the occurrence of an error may include an operation of receiving wireless power as power lower than a determined power level when the foreign object is detected based on the electrical change.

According to an embodiment, the operation of identifying the occurrence of an error may further include an operation of determining whether to maintain an operation of receiving wireless power from an external electronic device (e.g., the first external electronic device 103) or changing a level of the received power based on charging state information of the battery 189 reported by the power management module when the foreign object is detected based on the electrical change.

The electronic device according to certain embodiments disclosed in this document may be various forms of devices. The electronic device may include a portable communication device (e.g., a smartphone), a computer device, a mobile multimedia device, a portable medical device, a camera, a wearable device, or home appliances, for example. The electronic device according to an embodiment of this document is not limited to the aforementioned devices.

Certain embodiments of this document and terms used in the embodiments are not intended to limit the technical characteristics, described in this document, to specific embodiments, and should be understood as including various changes, equivalents or alternatives of a corresponding embodiment. In relation to the description of the drawings, similar reference numerals may be used for similar or related elements. A singular form of a noun corresponding to an item may include one item or a plurality of items unless explicitly described otherwise in the context. In this document, each of phrases, such as "A or B", "at least one of A and B", "at least one of A or B", "A, B or C", "at least one of A, B and C", and "at least one of A, B, or C", may include any one of items listed along with a corresponding one of the phrases or all possible combinations of the listed items. Terms, such as a "first", a "second", or "the first" or "the second", may be used to merely distinguish between a corresponding element and another corresponding element, and do not limit corresponding elements in another aspect (e.g., importance or a sequence). If any (e.g., first) element is described as being "coupled" or "connected" to another (e.g., a second) element along with a term "functionally" or "communicatively" or without such a term, this means that the any element may be coupled to the another element directly (e.g., in a wired way), wirelessly, or through a third element.

The term "module" used in certain embodiments of this document may include a unit implemented as hardware, software or firmware, and may be interchangeably used with a term, such as logic, a logical block, a part, or a circuit. The module may be an integrated part, or a minimum unit of the part or a part thereof, which performs one or more functions. For example, according to an embodiment, the module may be implemented in the form of an application-specific integrated circuit (ASIC).

Certain embodiments of this document may be implemented as software (e.g., the program 140) including one or more instructions stored in a storage medium (e.g., the embedded memory 136 or the external memory 138) readable by a machine (e.g., the electronic device 101). For example, a processor (e.g., the processor 120) of a machine (e.g., the electronic device 101) may invoke at least one of the one or more instructions stored in the storage medium, and may execute the instruction. This enables the machine to operate to perform at least one function based on the invoked at least one instruction. The one or more instructions may include a code generated by a complier or a code executable by an interpreter. The machine-readable storage media may be provided in the form of a non-transitory storage medium. In this case, "non-transitory" merely means that the storage medium is a tangible device and does not include a signal (e.g., electromagnetic wave). The term does not distinguish between a case where data is semi-permanently stored in the storage medium and a case where data is temporally stored in the storage medium.

According to an embodiment, the method according to certain embodiments disclosed in this document may be included in a computer program product and provided. The computer program product may be traded as a product between a seller and a purchaser. The computer program product may be distributed in the form of a machine-readable storage medium (e.g., a compact disc read only memory (CD-ROM)) or may be distributed through an app store (e.g., PlayStore™) or directly between two user devices (e.g., smartphones) or online (e.g., download or upload). In the case of the online distribution, at least some of the computer program products may be at least temporarily stored or provisionally generated in a machine-readable storage medium, such as the memory of the server of a manufacturer, the server of an app store or a relay server.

According to certain embodiments, each (e.g., module or program) of the described elements may include a single entity or a plurality of entities, and some of a plurality of entities may be separately disposed in another element. According to certain embodiments, one or more elements or operations of the aforementioned elements may be omitted or one or more other elements or operations may be added. Alternatively or additionally, a plurality of elements (e.g., modules or programs) may be integrated into a single element. In such a case, the integrated element may identically or similarly perform a function performed by a corresponding one of the plurality of elements before at least one function of the plurality of elements is integrated. According to certain embodiments, operations performed by a module, a program or another element may be executed sequentially, in parallel, iteratively or heuristically, or one or more of the operations may be executed in different order or may be omitted, or one or more other operations may be added.

What is claimed is:

1. An electronic device, comprising:
   a battery;
   a wireless power transfer (WPT) coil;
   wireless power transceiver circuitry electrically connected to the WPT coil, and configured to wirelessly receive power and/or wirelessly transmit power;
   a charging circuit electrically connected to the wireless power transceiver circuitry and the battery; and
   a processor electrically connected to the wireless power transceiver circuitry and the charging circuit,
   wherein the processor is configured to:
   receive first detecting power from an external electronic device,
   when the wireless power transceiver circuitry is operating in a reception mode, determine whether a reception voltage generated by the received first detecting power is higher than a first predetermined voltage value,
   based on detecting that the reception voltage is higher than the first predetermined voltage value, control the charging circuit to supply power from the battery to the wireless power transceiver circuitry,
   output, via the WPT coil, foreign object detecting power based on the supplied power, and
   based on detecting an electrical change in the foreign object detecting power caused by presence of a foreign object, determine that an error has occurred.

2. The electronic device of claim 1, further comprising a voltage conversion circuit,
   wherein the foreign object detecting power is generated from operation of at least one of the charging circuit and the voltage conversion circuit, when the reception voltage is higher than the first predetermined voltage value and lower than a second predetermined voltage value.

3. The electronic device of claim 1, further comprising communication circuitry, wherein the processor is further configured to:
   after outputting the foreign object detecting power, receive from the external electronic device a second detecting power;
   based on detecting an absence of the electrical change in the foreign object detecting power, determine an absence of the foreign object; and
   transmit a packet to the external electronic device indicating the absence of the foreign object, via the communication circuitry.

4. The electronic device of claim 3, wherein the processor is further configured to:
   execute a charging mode for the electronic device, including receiving power from the external electronic device via the wireless power transceiver circuitry.

5. The electronic device of claim 1, wherein the processor is further configured to:
   control the wireless power transceiver circuitry to operate in a standby state when detecting that the reception voltage generated by the first detecting power is lower than or equal to the predetermined voltage value.

6. The electronic device of claim 1, wherein the processor is further configured to:
   while transmitting the foreign object detecting power using the WPT coil, measure at least one of:
   a change in a voltage, a current and/or power caused by electromagnetic induction in a wireless power transmission and reception path, and
   a change in an attenuation waveform and an attenuation coefficient;
   wherein the presence of the foreign object is detected when:
   the change in the voltage, the current and/or the power is greater than a predetermined change threshold, and/or
   the change in the attenuation waveform and the attenuation coefficient is greater than the predetermined change threshold.

7. The electronic device of claim 1, further comprising an output module including at least one of:
   a display;
   a speaker; or
   a haptic actuator,
   wherein the processor is configured to output a notification indicating the presence of the foreign object through the output module.

8. The electronic device of claim 3, wherein the packet is not transmitted to the external electronic device when the error is determined to have occurred.

9. The electronic device of claim 1, wherein the processor is further configured to:
receive charging power from the external electronic device; and
when the error is determined to have occurred, reduce a level of received power.

10. The electronic device of claim 1, further comprising a power management module, wherein the processor is further configured to:
receive charging power from the external electronic device; and
when the error is determined to have occurred, determine whether to maintain receiving of the charging power, or to change receiving of the charging power,
wherein changing the receiving of the charging power includes changing a level of the received power based at least on charging state information of the battery, and
wherein the charging state information of the battery is determined by the power management module.

11. A method in an electronic device, comprising:
receiving, via wireless power transceiver circuitry, first detecting power from an external electronic device,
when the wireless power transceiver circuitry is operating in a reception mode, determine, via a processor, whether a reception voltage generated by the received first detecting power is higher than a first predetermined voltage value,
based on detecting that the reception voltage is higher than the first predetermined voltage value, supplying power, via a charging circuit, from the battery to the wireless power transceiver circuitry,
outputting, via a wireless power transfer (WPT) coil, foreign object detecting power based on the supplied power, and
based on detecting an electrical change in the foreign object detecting power caused by presence of a foreign object, determine, via the processor, that an error has occurred.

12. The method of claim 11, wherein the foreign object detecting power is generated from operation of at least one of the charging circuit and a voltage conversion circuit, when the reception voltage is higher than the first predetermined voltage value and lower than a second predetermined voltage value.

13. The method of claim 11, further comprising:
after outputting the foreign object detecting power, receiving from the external electronic device a second detecting power;
based on detecting an absence of the electrical change in the foreign object detecting power, determining an absence of the foreign object; and
transmitting, via communication circuitry, a packet to the external electronic device indicating the absence of the foreign object.

14. The method of claim 13, further comprising:
executing a charging mode for the electronic device, including receiving power from the external electronic device via the wireless power transceiver circuitry.

15. The method of claim 11, further comprising:
controlling, via the processor, the wireless power transceiver circuitry to operate in a standby state when detecting that the reception voltage generated by the first detecting power is lower than or equal to the predetermined voltage value.

16. The method of claim 11, further comprising:
while transmitting the foreign object detecting power using the WPT coil, measuring at least one of:
a change in a voltage, a current and/or power caused by electromagnetic induction in a wireless power transmission and reception path, and
a change in an attenuation waveform and an attenuation coefficient;
wherein the presence of the foreign object is detected when:
the change in the voltage, the current and/or the power is greater than a predetermined change threshold, and/or
the change in the attenuation waveform and the attenuation coefficient is greater than the predetermined change threshold.

17. The method of claim 11, further comprising:
outputting a notification indicating the presence of the foreign object through via an output module, including at least one of a display, a speaker or a haptic actuator.

18. The method of claim 13, wherein the packet is not transmitted to the external electronic device when the error is determined to have occurred.

19. The method of claim 11, further comprising:
receiving charging power from the external electronic device; and
when the error is determined to have occurred, reducing a level of received power.

20. The method of claim 11, further comprising:
receive charging power from the external electronic device; and
when the error is determined to have occurred, determine whether to maintain receiving of the charging power, or to change receiving of the charging power,
wherein changing the receiving of the charging power includes changing a level of the received power based at least on charging state information of the battery, and
wherein the charging state information of the battery is determined by the power management module.

* * * * *